US012604496B2

(12) United States Patent
Xie et al.

(10) Patent No.: US 12,604,496 B2
(45) Date of Patent: Apr. 14, 2026

(54) EPITAXY EVERYWHERE BASED SELF-ALIGNED DIRECT BACKSIDE CONTACT

(71) Applicant: International Business Machines Corporation, Armonk, NY (US)

(72) Inventors: Ruilong Xie, Niskayuna, NY (US); Kisik Choi, Watervliet, NY (US); Muthumanickam Sankarapandian, Niskayuna, NY (US); Shogo Mochizuki, Mechanicville, NY (US)

(73) Assignee: International Business Machines Corporation, Armonk, NY (US)

( * ) Notice: Subject to any disclaimer, the term of this patent is extended or adjusted under 35 U.S.C. 154(b) by 691 days.

(21) Appl. No.: 17/950,316

(22) Filed: Sep. 22, 2022

(65) Prior Publication Data

US 2024/0105799 A1 Mar. 28, 2024

(51) Int. Cl.
H10D 30/67 (2025.01)
H10D 30/01 (2025.01)
(Continued)

(52) U.S. Cl.
CPC ....... H10D 30/6735 (2025.01); H10D 30/031 (2025.01); H10D 30/6757 (2025.01);
(Continued)

(58) Field of Classification Search
CPC .. H10D 30/67; H10D 30/6735; H10D 62/119; H10D 62/121; H10D 62/118;
(Continued)

(56) References Cited

U.S. PATENT DOCUMENTS

| 10,354,927 | B2 | 7/2019 | Loubet et al. |
| 10,453,850 | B2 | 10/2019 | Smith et al. |

(Continued)

FOREIGN PATENT DOCUMENTS

DE 102020129673 A1 9/2021

OTHER PUBLICATIONS

J. Smith, "Design Technology Co-Optimization Approaches for Integration and Migration to CFET and 3D Logic," In The Surface Preparation and Cleaning Conference (SPCC) 2019 (30 pages).
(Continued)

*Primary Examiner* — Wasiul Haider
(74) *Attorney, Agent, or Firm* — Samuel A. Waldbaum

(57) ABSTRACT

Self-aligned direct backside contacts by an epitaxy everywhere under source/drain region approach are provided. In one aspect, a semiconductor device includes: a field-effect transistor(s) on a backside interlayer dielectric; an epitaxial contact placeholder in the backside interlayer dielectric that directly contacts a first source/drain region of the field-effect transistor(s); and a self-aligned direct backside contact in the backside interlayer dielectric that directly contacts a second source/drain region of the field-effect transistor(s). The epitaxial contact placeholder extends a distance d1 into the backside interlayer dielectric from the first source/drain region, and the self-aligned direct backside contact extends a distance d2 into the backside interlayer dielectric from the second source/drain region, where d2>d1. The field-effect transistor(s) can include a stack of active layers surrounded by a gate, and the first/second source/drain regions on opposite sides thereof. A method of fabricating the present semiconductor device is also provided.

13 Claims, 40 Drawing Sheets

(51) Int. Cl.

| | |
|---|---|
| *H10D 62/10* | (2025.01) |
| *H10D 64/01* | (2025.01) |
| *H10D 64/23* | (2025.01) |
| *H10D 86/00* | (2025.01) |

(52) U.S. Cl.

CPC ........... *H10D 62/121* (2025.01); *H10D 64/01* (2025.01); *H10D 64/256* (2025.01); *H10D 86/201* (2025.01)

(58) Field of Classification Search

CPC ............ H10D 64/256; H10D 30/0198; H10D 62/151; H10D 64/251; H10D 84/038; H10D 84/83; H10D 30/6748; H10W 20/427

See application file for complete search history.

(56) References Cited

U.S. PATENT DOCUMENTS

| 10,741,556 | B2 | 8/2020 | Mulfinger et al. |
| 10,804,379 | B2 | 10/2020 | Zang et al. |
| 11,164,958 | B2 | 11/2021 | Mochizuki et al. |
| 11,227,922 | B2 | 1/2022 | Li et al. |
| 2021/0111115 | A1 | 4/2021 | Morrow et al. |
| 2021/0134721 | A1 | 5/2021 | Chiang et al. |
| 2021/0202385 | A1 | 7/2021 | Huang et al. |
| 2021/0305252 | A1 | 9/2021 | Chiang et al. |
| 2021/0305381 | A1 | 9/2021 | Chiang et al. |
| 2021/0351303 | A1 | 11/2021 | Ju et al. |
| 2021/0376071 | A1 | 12/2021 | Liu et al. |
| 2021/0376093 | A1 | 12/2021 | Chu et al. |
| 2021/0407994 | A1* | 12/2021 | Su .......................... H10D 84/83 |
| 2022/0102274 | A1 | 3/2022 | Chien et al. |
| 2022/0223689 | A1 | 7/2022 | Hsu et al. |
| 2023/0061857 | A1* | 3/2023 | Lin ...................... H10D 84/038 |

OTHER PUBLICATIONS

A.P. Jacob et al., "Scaling Challenges for Advanced CMOS Devices," International Journal of High Speed Electronics and Systems, vol. 26, No. 01n02, 1740001 (2017) (76 pages).

\* cited by examiner

Device stacks

Sacrificial gates

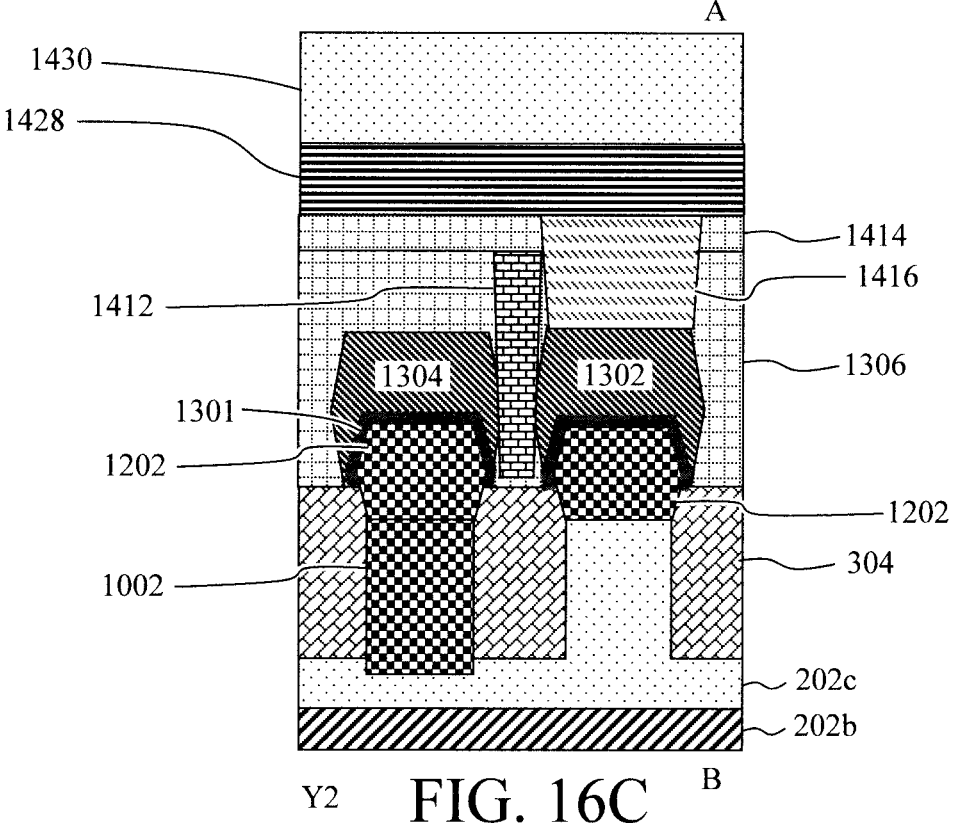
1430
1428
1412
1301
1202
1002
1304
1302
A
1414
1416
1306
1202
304
202c
202b
Y2        FIG. 16C        B

1430

1428

1414

1416

1412

1304        1302

1301

1306

1202

304

1902

Y2        2002        B

EPITAXY EVERYWHERE BASED SELF-ALIGNED DIRECT BACKSIDE CONTACT

FIELD OF THE INVENTION

The present invention relates to semiconductor device backside interconnect structures, and more particularly, to source/drain region self-aligned direct backside contacts and techniques for fabrication thereof using an epitaxy everywhere under source/drain region approach.

BACKGROUND OF THE INVENTION

Semiconductor devices such as nanosheet field-effect transistors often employ bottom dielectric isolation technology. To do so, a dielectric layer is implemented between the source/drain region epitaxy and the underlying substrate.

In certain situations, however, there are notable drawbacks to bottom dielectric isolation-based device architectures. For instance, the bottom dielectric isolation layer ideally serves as a protective barrier for the source/drain regions during backside contact processing. However, any defects such as pin holes in the bottom dielectric isolation layer leave the source/drain regions exposed to potential damage. Further, the presence of a dielectric impacts the epitaxy growth behavior and thus uniformity of source/drain regions grown over the bottom dielectric isolation.

Therefore, semiconductor device designs without bottom dielectric isolation that enable the formation of uniform, high-quality source/drain region epitaxy, which remains protected during backside contact processing would be desirable.

SUMMARY OF THE INVENTION

The present invention provides semiconductor device designs with source/drain region self-aligned direct backside contacts fabricated by an epitaxy everywhere under source/drain region approach. In one aspect of the invention, a semiconductor device is provided. The semiconductor device includes: at least one field-effect transistor on a backside interlayer dielectric; an epitaxial contact placeholder embedded in, and surrounded by, the backside interlayer dielectric, where the epitaxial contact placeholder directly contacts a first source/drain region of the at least one field-effect transistor; and a self-aligned direct backside contact embedded in, and surrounded by, the backside interlayer dielectric, where the self-aligned direct backside contact directly contacts a second source/drain region of the at least one field-effect transistor. The epitaxial contact placeholder extends a distance d1 into the backside interlayer dielectric from the first source/drain region, and the self-aligned direct backside contact extends a distance d2 into the backside interlayer dielectric from the second source/drain region, where d2>d1.

In another aspect of the invention, another semiconductor device is provided. The semiconductor device includes: at least one field-effect transistor on a backside interlayer dielectric, where the at least one field-effect transistor includes a stack of active layers, a gate surrounding the active layers in a gate-all-around configuration, and source/drain regions on opposite sides of the stack of active layers; an epitaxial contact placeholder embedded in, and surrounded by, the backside interlayer dielectric, where the epitaxial contact placeholder directly contacts a first one of the source/drain regions; and a self-aligned direct backside contact embedded in, and surrounded by, the backside interlayer dielectric, where the self-aligned direct backside contact directly contacts a second one of the source/drain regions. The epitaxial contact placeholder extends a distance d1 into the backside interlayer dielectric from the first one of the source/drain regions, and the self-aligned direct backside contact extends a distance d2 into the backside interlayer dielectric from the second one of the source/drain regions, where d2>d1.

In yet another aspect of the invention, a method of fabricating a semiconductor device is provided. The method includes: forming at least a first trench and a second trench in a wafer, where the first trench extends a depth D1 in the wafer and the second trench extends a depth D2 in the wafer, and where D1<D2; growing a shallow epitaxial contact placeholder in the first trench and a deep epitaxial contact placeholder in the second trench; forming a first source/drain region of a field-effect transistor in direct contact with the shallow epitaxial contact placeholder in the first trench, and a second source/drain region of the field-effect transistor in direct contact with the deep epitaxial contact placeholder in the second trench, where the first source/drain region and the second source/drain region are positioned on opposite sides of a stack of active layers; removing the wafer; depositing a backside interlayer dielectric over and surrounding both the shallow epitaxial contact placeholder and the deep epitaxial contact placeholder; removing the deep epitaxial contact placeholder to form a cavity in the backside interlayer dielectric; and forming a self-aligned direct backside contact in the cavity that directly contacts the second source/drain region.

A more complete understanding of the present invention, as well as further features and advantages of the present invention, will be obtained by reference to the following detailed description and drawings.

BRIEF DESCRIPTION OF THE DRAWINGS

FIG. 16C is a Y2 cross-sectional view illustrating an etch having been used to remove the substrate, stopping on the etch stop layer according to an embodiment of the present invention;

DETAILED DESCRIPTION OF PREFERRED EMBODIMENTS

Provided herein are semiconductor device source/drain region self-aligned direct backside contacts and techniques for fabrication thereof using an epitaxy everywhere under source/drain region approach. As will be described in detail below, the present techniques involve the use of a unique deep/shallow epitaxy-based placeholder design which advantageously enables the formation of very uniform, high-quality/low-defect source/drain region epitaxy since it is grown everywhere on the placeholders (rather than on a bottom dielectric isolation layer), and the complete removal of the underlying substrate for self-aligned direct backside contact formation without the risk of damaging the source/drain region epitaxy due to the placeholders being present everywhere under (and protecting) the source/drain regions.

Figure 1:
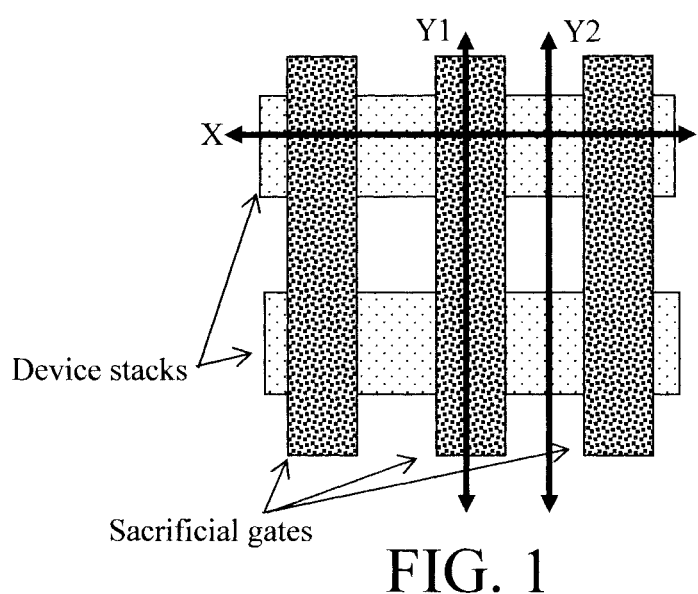
FIG. 1 is a top-down diagram illustrating the overall layout of the present semiconductor device and the orientations of the X, Y1 and Y2 cross-sectional views shown in the figures according to an embodiment of the present invention.

An exemplary methodology for fabricating a semiconductor device in accordance with the present techniques using an epitaxy everywhere under source/drain region approach is now described by way of reference to FIGS. 1-21. FIG. 1 is a top-down diagram illustrating an overall layout of the present semiconductor device design. As shown in FIG. 1, the present semiconductor device includes at least one active area having, for example, device stacks of sacrificial/active layers on a frontside of a wafer (see below), and sacrificial gates disposed over, and oriented orthogonal to, the active area(s).

The term "sacrificial," as used herein, generally refers to any material or structure that is used in one part of the process, and then later removed, in whole or in part, during fabrication of the semiconductor device. Thus, as is apparent from FIG. 1, a gate-last approach will be employed in the present example. With a gate-last approach, sacrificial gates are used as a placeholder during formation of the source/ drain regions. The sacrificial gates are removed later on in the process, and replaced with the final gates of the device (also referred to herein as "replacement gates"). When the replacement gates are metal gates, they may also be referred to herein as "replacement metal gates." Advantageously, use of a gate-last process avoids exposing the replacement gate materials such as high-κ dielectrics to potentially damaging conditions such as the high temperatures experienced during source/drain region formation.

FIG. 1 further illustrates the orientations of the cross-sectional views that will be illustrated in the following figures. For instance, as shown in FIG. 1, the X cross-sectional views shown in the following figures depict cuts through one of the active areas, across each of the sacrificial gates. The Y1 cross-sectional views depict cuts, perpendicular to the X cross-sectional views, through one of the sacrificial gates. The Y2 cross-sectional views depict cuts, also perpendicular to the X cross-sectional views, but in between two of the sacrificial gates.

Figure 2:
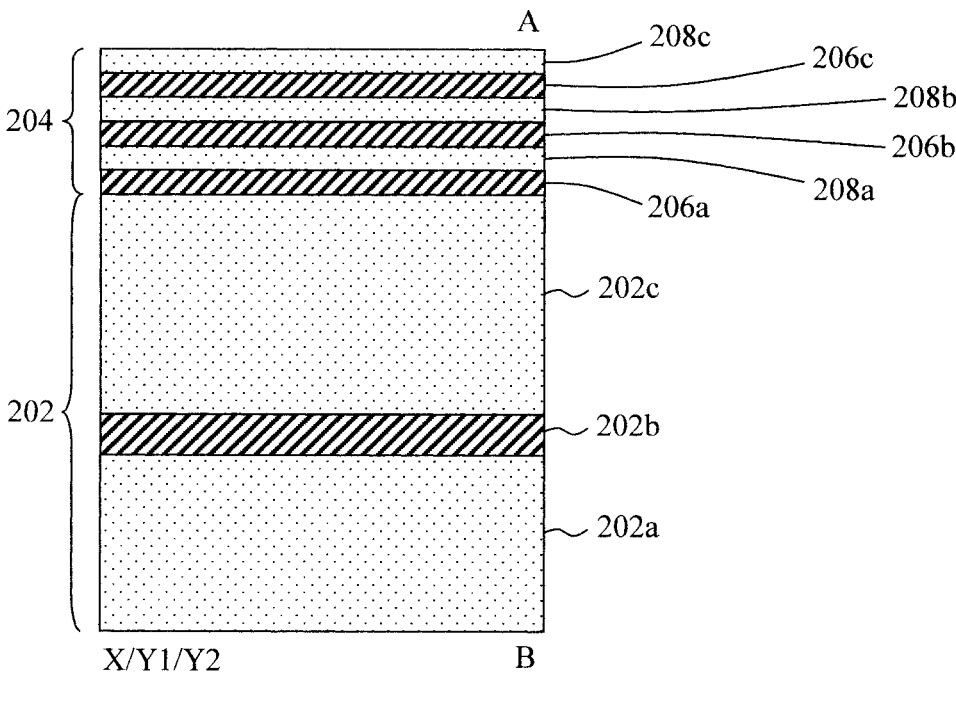
FIG. 2 is an X/Y1/Y2 cross-sectional view illustrating a stack of sacrificial/active layers having been formed on a first side (A), i.e., frontside, of a wafer (having a substrate, an etch stop layer, and a semiconductor layer) according to an embodiment of the present invention.

As shown in FIG. 2 (which appears the same for X, Y1 and Y2 cross-sectional views), the process begins with the formation of a sacrificial/active layer stack 204 on a first side (A), i.e., the frontside, of a wafer 202. According to an exemplary embodiment, wafer 202 includes a substrate 202a, an etch stop layer 202b disposed directly on the substrate 202a, and a semiconductor layer 202c disposed directly on the etch stop layer 202b. As will be described in detail below, etch stop layer 202b will be used during removal of the substrate 202a from a second side (B), i.e., the backside, of wafer 202. By way of example only, etch stop layer 202b can have a thickness of from about 2 nanometers (nm) to about 50 nm.

In one exemplary embodiment, substrate 202a is a bulk semiconductor wafer, such as a bulk silicon (Si) wafer, and etch stop layer 202b is formed from silicon germanium (SiGe) that is epitaxially grown from the (Si) substrate 202a. In turn, semiconductor layer 202c (e.g., Si) can be epitaxially grown from the etch stop layer 202b. In that case, the etch stop layer 202b is preferably formed from a low germanium (Ge) content SiGe. For instance, in one exemplary embodiment, low Ge content SiGe is SiGe having from about 15% Ge to about 35% Ge. For example, in one non-limiting embodiment, etch stop layer 202b is formed from SiGe30 (which is SiGe having a Ge content of about 30%). It is notable that, in SiGe, as the Ge concentration increases, high-density defects are generated. Thus, using a low Ge content SiGe for the etch stop layer 202b minimizes the risk of having defects in the material. In that regard, it is further notable that the present semiconductor device designs do not employ bottom dielectric isolation, which provides the added benefit of avoiding the need for the high Ge content SiGe in the sacrificial/active layer stack 204 that is often used as a placeholder for the bottom dielectric isolation layer.

Alternatively, according to another exemplary embodiment, etch stop layer 202b is an oxide layer. In that case, wafer 202 can be a semiconductor-on-insulator or SOI wafer. An SOI wafer has an SOI layer separated from an underlying substrate by a buried insulator. When the buried insulator is an oxide, it is also referred to herein as a buried oxide or BOX. In the present example, the substrate, BOX, and SOI layer correspond to the substrate 202a, the (oxide) etch stop layer 202b, and the semiconductor layer 202c, respectively. As above, the SOI layer/semiconductor layer 202c can include any suitable semiconductor material(s), such as Si.

Sacrificial/active layer stack 204 includes alternating sacrificial and active layers oriented horizontally one on top of another on wafer 202 (in particular, on semiconductor layer 202c of wafer 202). In one exemplary embodiment, the sacrificial and active layers are nanosheets. The term "nanosheet" as used herein, generally refers to a sheet or a layer having nanoscale dimensions. Further, the term "nanosheet" is meant to encompass other nanoscale structures such as nanowires. For instance, the term "nanosheet" can refer to a nanowire with a larger width, and/or the term "nanowire" can refer to a nanosheet with a smaller width, and vice versa.

Specifically, as shown in FIG. 2, the sacrificial/active layer stack 204 includes alternating layers of sacrificial layers 206a,b,c, etc. and active layers 208a,b,c, etc. deposited on the wafer 202. The present techniques involve the formation of at least one field-effect transistor of the semiconductor device on the first side (A), i.e., frontside, of the wafer 202 which, as will be described in detail below, includes removal of the sacrificial layers 206a,b,c, etc. later on in the process to permit the formation of a gate-all-around configuration for the semiconductor device. By contrast, active layers 208a,b,c, etc. will remain in place and serve as channels of the field-effect transistor(s). It is notable that the number of sacrificial layers 206a,b,c, etc. and active layers 208a,b,c, etc. shown in the figures is provided merely as an example to illustrate the present techniques. For instance, embodiments are contemplated herein where more or fewer sacrificial layers 206a,b,c, etc. and/or more or fewer active layers 208a,b,c, etc. are present than shown. According to an exemplary embodiment, each of the sacrificial layers 206a, b,c, etc. and each of the active layers 208a,b,c, etc. is deposited/formed on semiconductor layer 202c of wafer 202 using an epitaxial growth process. According to an exemplary embodiment, each of the sacrificial layers 206a,b,c, etc. and each of the active layers 208a,b,c, etc. has a thickness of from about 6 nm to about 25 nm.

The materials employed for the sacrificial layers 206a,b,c, etc. and active layers 208a,b,c, etc. are such that the sacrificial layers 206a,b,c, etc. can be removed selective to the active layers 208a,b,c, etc. during fabrication. For instance, according to an exemplary embodiment, the sacrificial layers 206a,b,c, etc. are each formed from SiGe, while the active layers 208a,b,c, etc. are each formed from Si. Etchants such as wet hot SC1, vapor phase hydrogen chloride (HCl), vapor phase chlorine trifluoride ($ClF_3$) and other reactive clean processes (RCP) are selective for etching of SiGe versus Si. In that case, the sacrificial layers 206a,b,c, etc. are preferably formed from a low Ge content SiGe, i.e., SiGe having from about 15% Ge to about 35% Ge, thereby minimizing the risk of high-density defects as described above. For example, in one non-limiting embodiment, the sacrificial layers 206a,b,c, etc. are formed from SiGe30. This is, however, only one exemplary combination of sacrificial/active material that may be employed in accordance with the present techniques. For instance, by way of example only, the opposite configuration can instead be implemented where the sacrificial layers 206a,b,c, etc. are each formed from Si, and the active layers 208a,b,c, etc. are each formed from (low Ge content) SiGe.

Figures 3A, 3B:
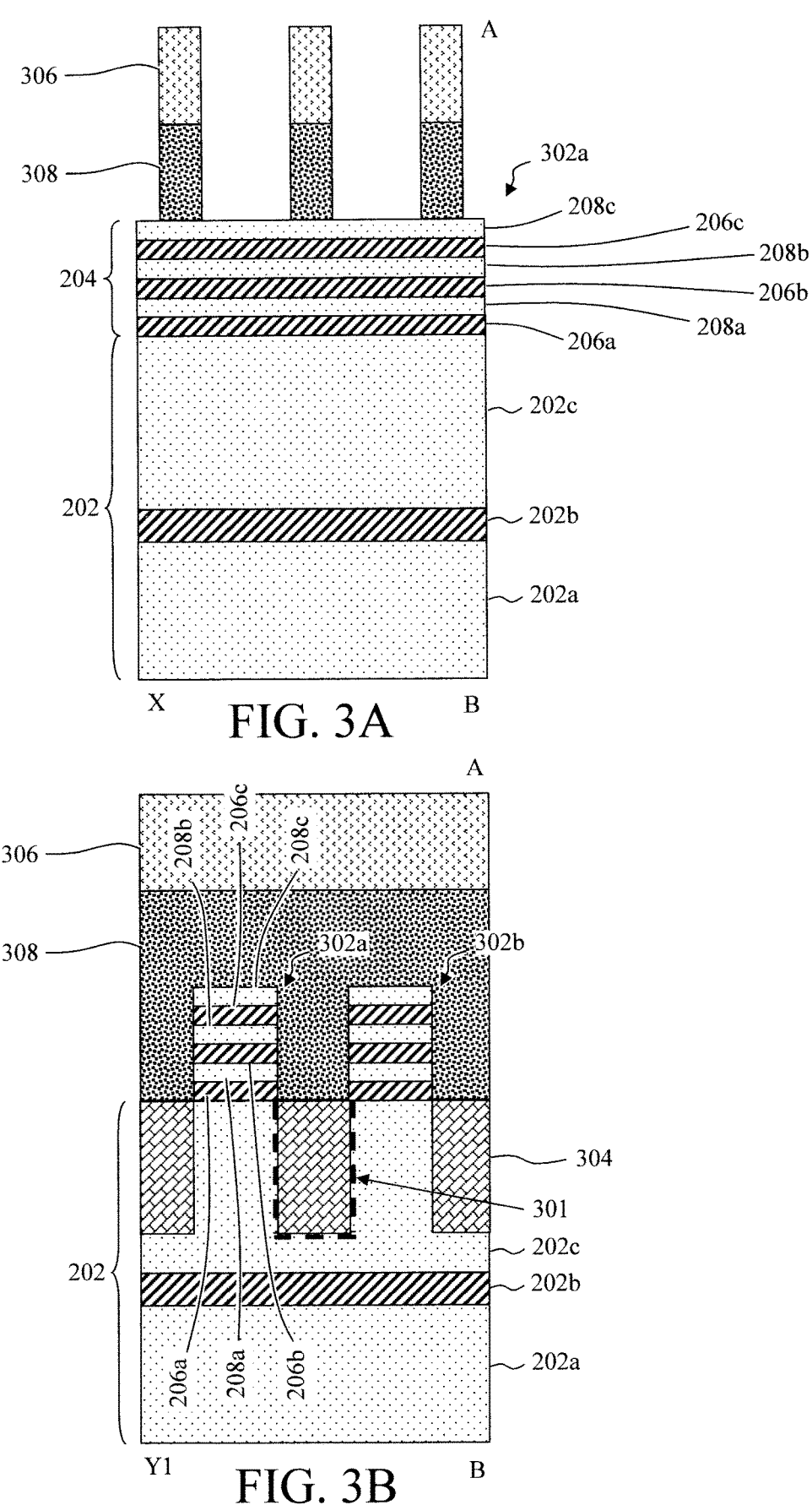
FIG. 3A is an X cross-sectional view.
FIG. 3B is a Y1 cross-sectional view.
Figure 3C:
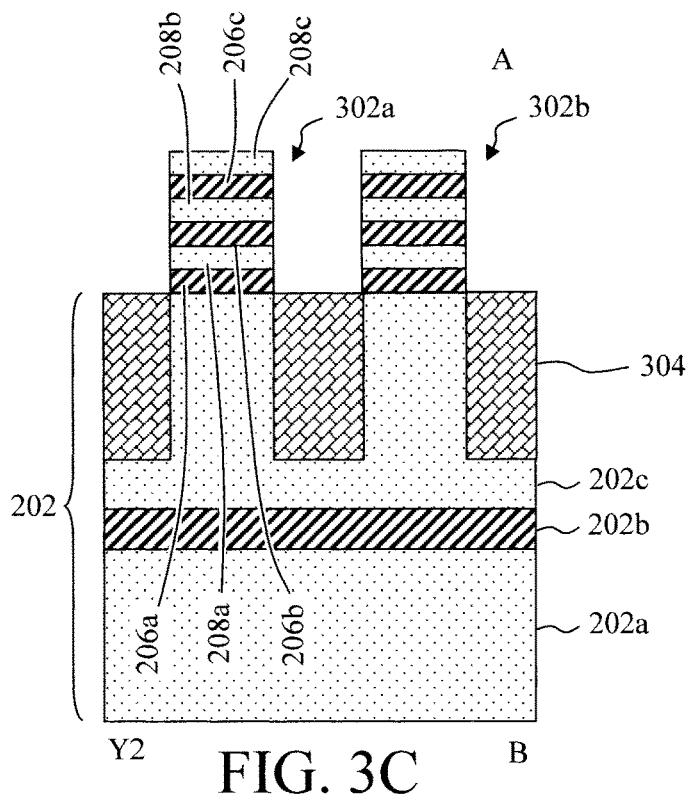
FIG. 3C is a Y2 cross-sectional view illustrating the sacrificial/active layer stack having been patterned into individual device stacks, shallow trench isolation regions having been formed in the wafer between the device stacks, and sacrificial gates having been formed on the device stacks using sacrificial gate hardmasks according to an embodiment of the present invention.

As shown in FIG. 3A (an X cross-sectional view), FIG. 3B (a Y1 cross-sectional view) and FIG. 3C (a Y2 cross-sectional view), the sacrificial/active layer stack 204 is next patterned into individual device stacks 302a,b, etc. each containing a patterned portion of the sacrificial layers 206a, b,c, etc. and active layers 208a,b,c, etc., shallow trench isolation regions 304 are formed in the wafer 202 between the device stacks 302a,b, etc., and sacrificial gates 308 are formed on the device stacks 204a,b,c,d, etc.

Standard lithography and etching techniques can be employed to pattern the sacrificial/active layer stack 204 into the individual device stacks 302a,b, etc. With standard lithography and etching techniques, a lithographic stack (not shown), e.g., photoresist/anti-reflective coating/organic planarizing layer, is used to pattern a hardmask (not shown) with the footprint and location of the device stacks 302a,b, etc. Alternatively, the hardmask can be formed by other suitable techniques, including but not limited to, sidewall image transfer (SIT), self-aligned double patterning (SADP), self-aligned quadruple patterning (SAQP), and other self-aligned multiple patterning (SAMP).

An etch is then performed to transfer the pattern from the hardmask to the underlying sacrificial/active layer stack 204 to form the individual device stacks 302a,b, etc. Suitable etching processes for the stack etch include, but are not limited to, directional (anisotropic) etching processes such as reactive ion etching. As shown for example in FIG. 3B, the etch used to pattern the device stacks 302a,b, etc. is extended beyond stack 204 resulting in the patterning of trenches 301 in the semiconductor layer 202c of wafer 202 between the device stacks 302a,b, etc.). For clarity, a dashed outline is used in FIG. 3B to illustrate one of these trenches 301, with the understanding that a trench 301 is present at the location of each shallow trench isolation region 304. Namely, the shallow trench isolation regions 304 are then formed in the trenches 301 between the device stacks 302a,b, etc. Shallow trench isolation regions 304 serve to isolate the device stacks 302a,b, etc.

To form the shallow trench isolation regions 304, a dielectric such as an oxide (which may also be generally referred to herein as a 'shallow trench isolation oxide') is deposited into, and filling, the trenches 301, followed by planarization and recess. Although not explicitly shown in the figures, a liner (e.g., a thermal oxide or silicon nitride (SiN)) may be deposited into the trenches 301 prior to the shallow trench isolation oxide. Suitable shallow trench isolation oxides include, but are not limited to, oxide low-κ materials such as silicon oxide (SiOx) and/or oxide ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH). A process such as chemical vapor deposition (CVD), atomic layer deposition (ALD), or physical vapor deposition (PVD) can be employed to deposit the shallow trench isolation oxide, after which the shallow trench isolation oxide can be planarized using a process such as chemical mechanical polishing. After that, the shallow trench isolation oxide is recessed using a dry or wet etch process to form the shallow trench isolation regions 304 at a base of the device stacks 302a,b, etc.

To form the sacrificial gates 308, a sacrificial gate material is first blanket deposited over the device stacks 302a,b, etc. Suitable sacrificial gate materials include, but are not limited to, poly-silicon and/or amorphous silicon. A process such as CVD, ALD or PVD can be employed to deposit the sacrificial gate material over the device stacks 302a,b, etc. According to an exemplary embodiment, a thin (e.g., from about 1 nm to about 3 nm) layer of SiOx (not shown) is first formed on the device stacks 302a,b, etc., followed by deposition of the poly-silicon and/or amorphous silicon.

Sacrificial gate hardmasks 306 are then formed on the sacrificial gate material marking the footprint and location of each of the sacrificial gates 308. Suitable hardmask materials include, but are not limited to, silicon nitride (SiN), silicon dioxide ($SiO_2$), titanium nitride (TiN) and/or silicon oxynitride (SiON). An etch using the sacrificial gate hardmasks 306 is then used to pattern the sacrificial gate material into the individual sacrificial gates 308 shown in FIGS. 3A-C.

Figure 4A:
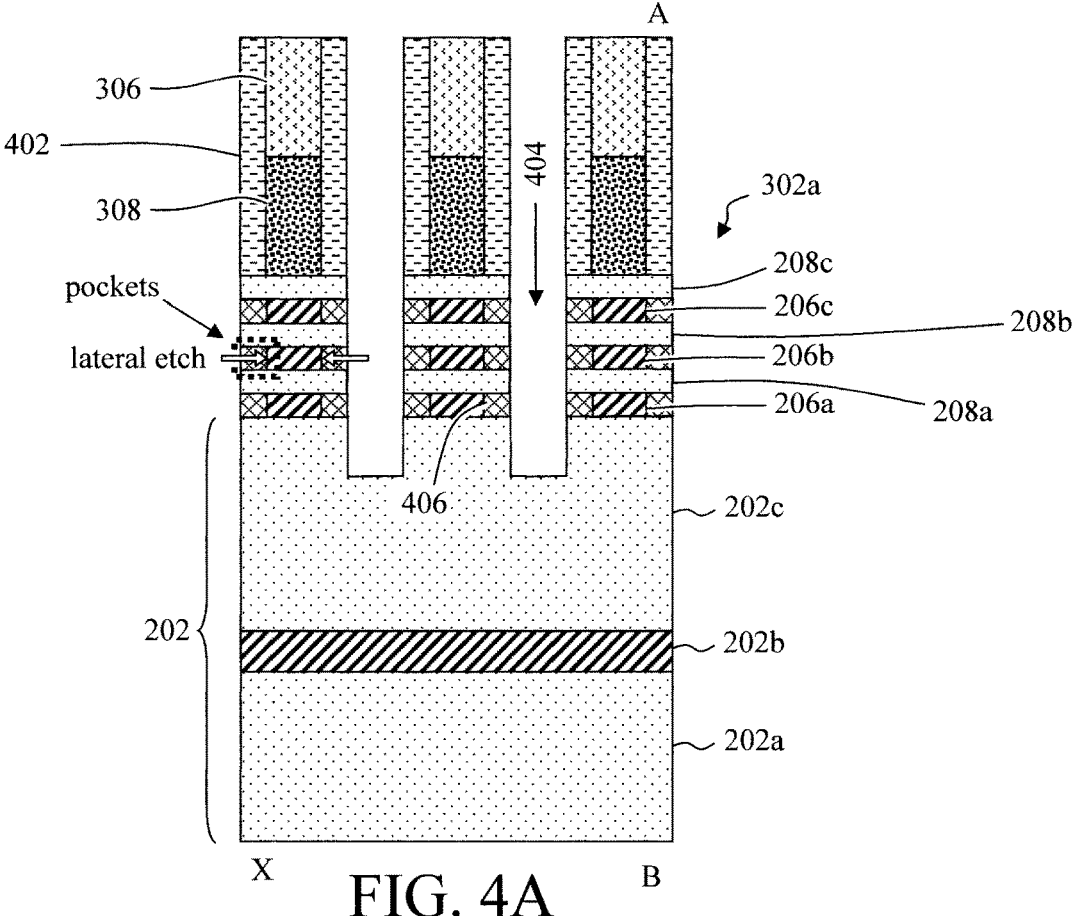
FIG. 4A is an X cross-sectional view.
Figure 4B:
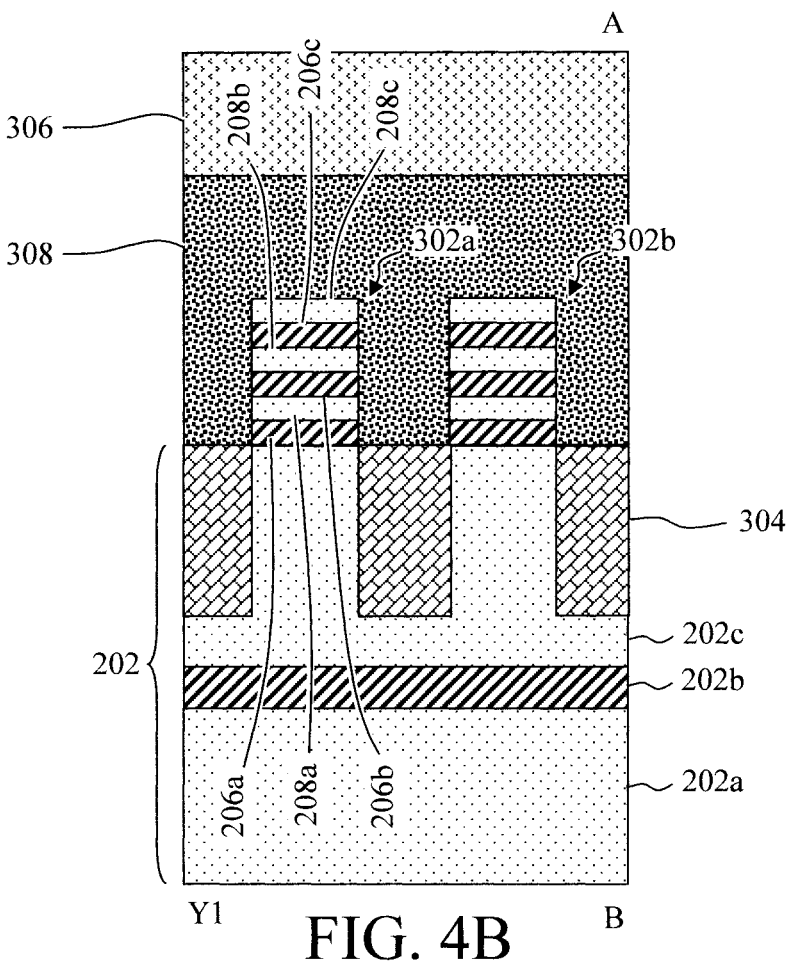
FIG. 4B is a Y1 cross-sectional view.
Figure 4C:
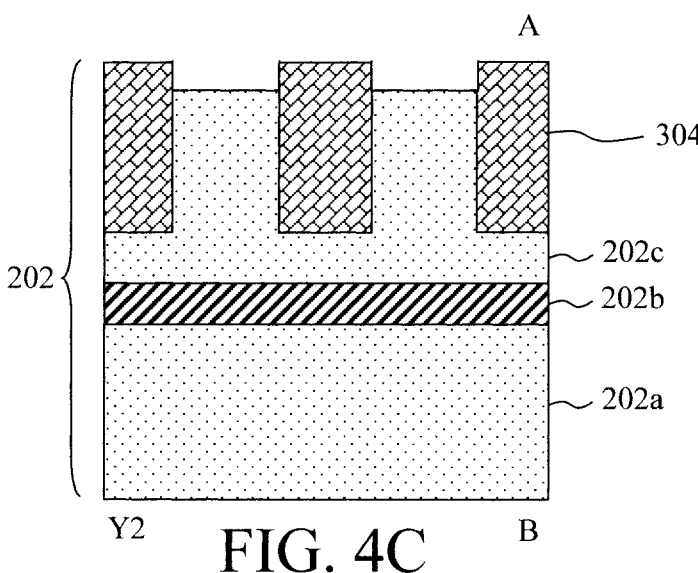
FIG. 4C is a Y2 cross-sectional view illustrating dielectric spacers having been formed alongside the sacrificial gate hardmasks/sacrificial gates, first/shallow trenches having been patterned in the device stacks and semiconductor layer of the wafer between the sacrificial gates, and inner spacers having been formed alongside the sacrificial layers within the first/shallow trenches according to an embodiment of the present invention.

As shown in FIG. 4A (an X cross-sectional view), FIG. 4B (a Y1 cross-sectional view) and FIG. 4C (a Y2 cross-sectional view), dielectric spacers 402 are then formed alongside the sacrificial gate hardmasks 306 and sacrificial gates 308, the gate hardmasks 306/sacrificial gates 308 and dielectric spacers 402 are used as a mask to pattern first/ shallow trenches 404 in the device stacks 302a,b, etc. between the sacrificial gates 308 which extend into the semiconductor layer 202c of wafer 202, and inner spacers 406 are formed alongside the sacrificial layers 206a,b,c, etc. within the first/shallow trenches 404.

To form the dielectric spacers 402, a dielectric spacer material is first deposited over the device stacks 302a,b, etc., followed by a directional (anisotropic) etching process such as reactive ion etching to pattern the dielectric spacer material into the dielectric spacers 402 alongside the sacrificial gate hardmasks 306 and sacrificial gates 308. Suitable dielectric spacer materials include, but are not limited to, SiOx, silicon carbide (SiC), silicon oxycarbide (SiCO), SiN, silicoboron carbonitride (SiBCN) and/or silicon oxycarbonitride (SiOCN), which can be deposited using a process such as CVD, ALD or PVD.

A directional (anisotropic) etching process such as reactive ion etching can be employed to form the first/shallow trenches 404. Preferably, the etchant employed for this trench etch is selective for etching the semiconductor layer 202c relative to the shallow trench isolation oxide. That way, the shallow trench isolation regions 304 remain intact. As shown in FIGS. 4A-C, the first/shallow trenches 404 extend into the underlying semiconductor layer 202c below the device stacks 302a,b, etc. However, the term 'shallow' is used to indicate that, at this point in the process, the trenches 404 extend only into an upper surface of the semiconductor layer 202c. Later on, one or more of these trenches 404 will be selectively extended farther into the semiconductor layer 202c, forming second/deep trenches (see below).

To form the inner spacers 406, a selective lateral etch is performed to first recess the sacrificial layers 206a,b,c, etc. exposed along the sidewalls of the first/shallow trenches 404. This recess etch forms pockets along the sidewalls of the first/shallow trenches 404 that are then filled with a dielectric spacer material to form the inner spacers 406 within the pockets. The inner spacers 406 will serve to offset the replacement gates from the source/drain regions (see below). As provided above, the sacrificial layers 206a,b,c, etc. can be formed from SiGe. In that case, a SiGe-selective non-directional (isotropic) etching process can be used for the recess etch. Suitable dielectric spacer materials for inner spacers 406 include, but are not limited to, silicon nitride (SiN), SiOx, SiC and/or SiCO. A process such as CVD, ALD or PVD can be employed to deposit the dielectric spacer material into the pockets, after which excess spacer material can be removed from the first/shallow trenches 404 using an isotropic etching process such as reactive ion etching.

Figure 5A:
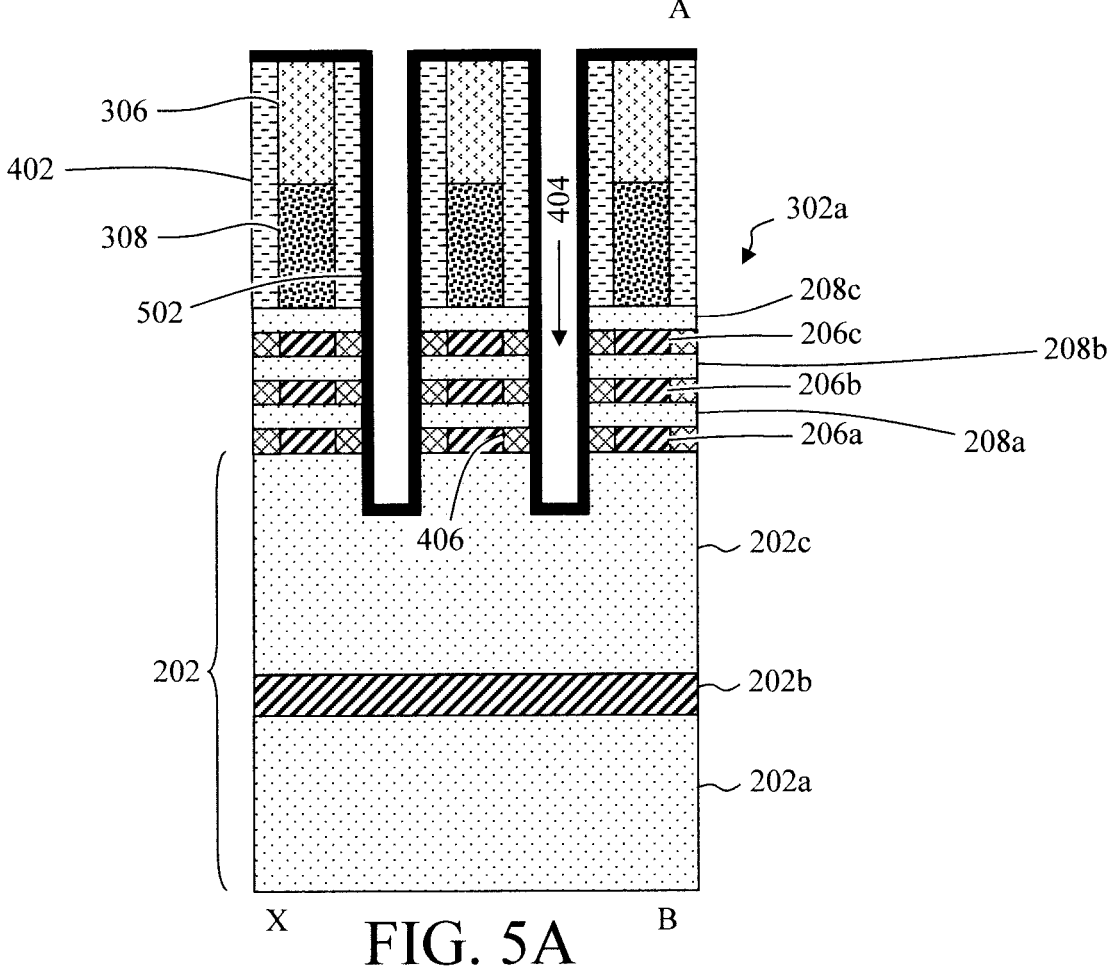
FIG. 5A is an X cross-sectional view.
Figure 5B:
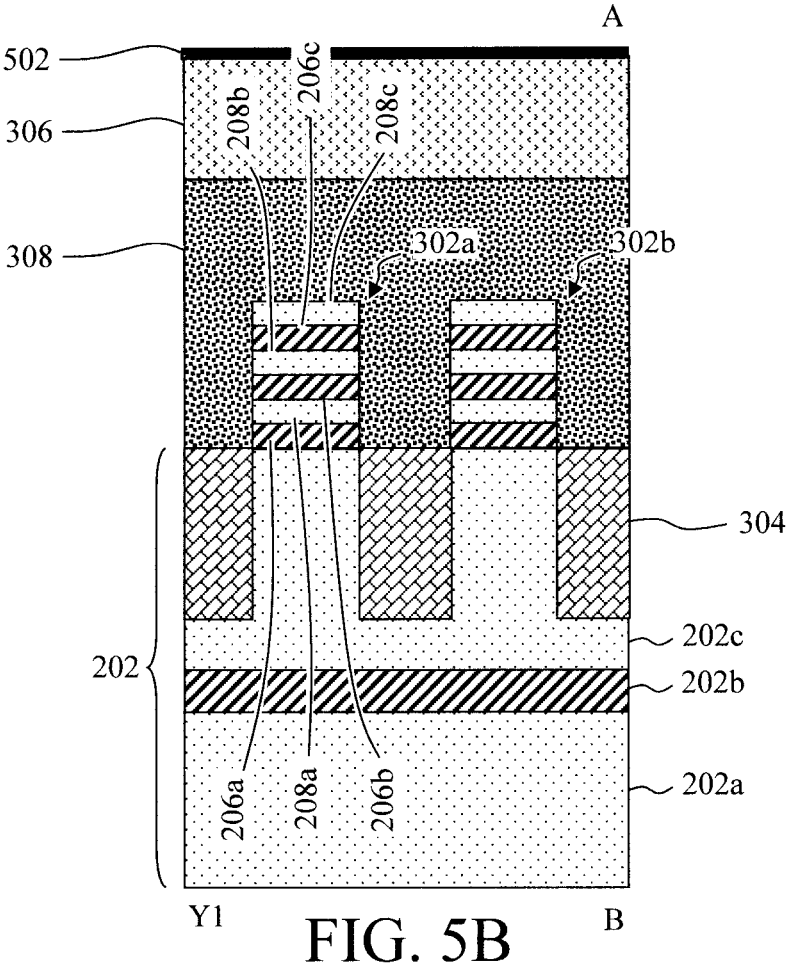
FIG. 5B is a Y1 cross-sectional view.
Figure 5C:
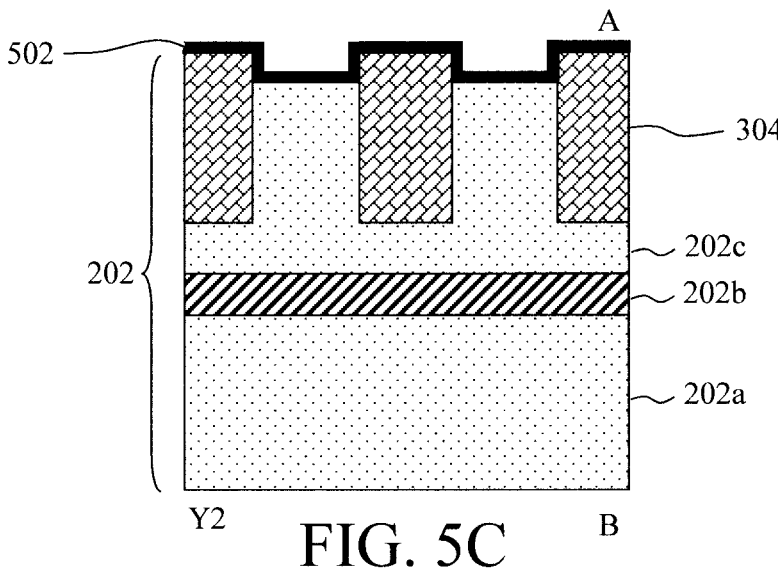
FIG. 5C is a Y2 cross-sectional view illustrating a protective layer having been formed over the sacrificial gate hardmasks/sacrificial gates/dielectric spacers and lining the first/shallow trenches according to an embodiment of the present invention.

As shown in FIG. 5A (an X cross-sectional view), FIG. 5B (a Y1 cross-sectional view) and FIG. 5C (a Y2 cross-sectional view), a protective layer 502 is formed over the sacrificial gate hardmasks 306/sacrificial gates 308/dielectric spacers 402 and lining the first/shallow trenches 404. As its name implies, the protective layer 502 will serve to protect those of the first/shallow trenches 404 that are to remain at their present depth, while others of the first/shallow trenches 404 are extended to form second/deep trenches as described in detail below. As will also described in detail below, the protective layer 502 will serve to limit (bottom-up) growth of a first epitaxial contact placeholder to only those second/deep trenches. Suitable materials for the protective layer 502 include, but are not limited to SiN, SiON, titanium oxide (TiOx), TiN, aluminum oxide (AlOx) and/or SiC which can be deposited using a process such as CVD, ALD or PVD. According to an exemplary embodiment, the protective layer 502 has a thickness of from about 1 nm to about 4 nm.

Figure 6A:
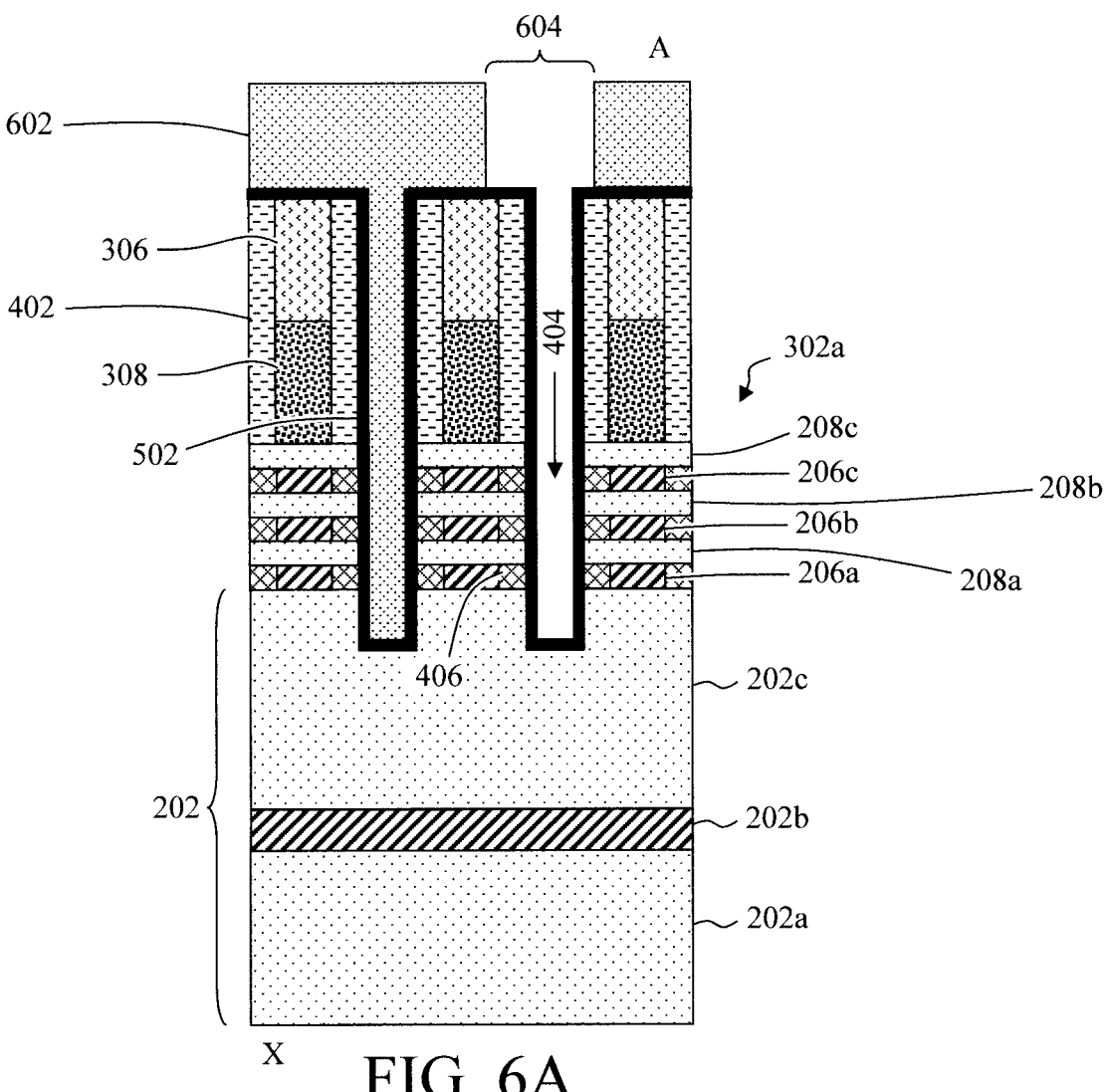
FIG. 6A is an X cross-sectional view.
Figure 6B:
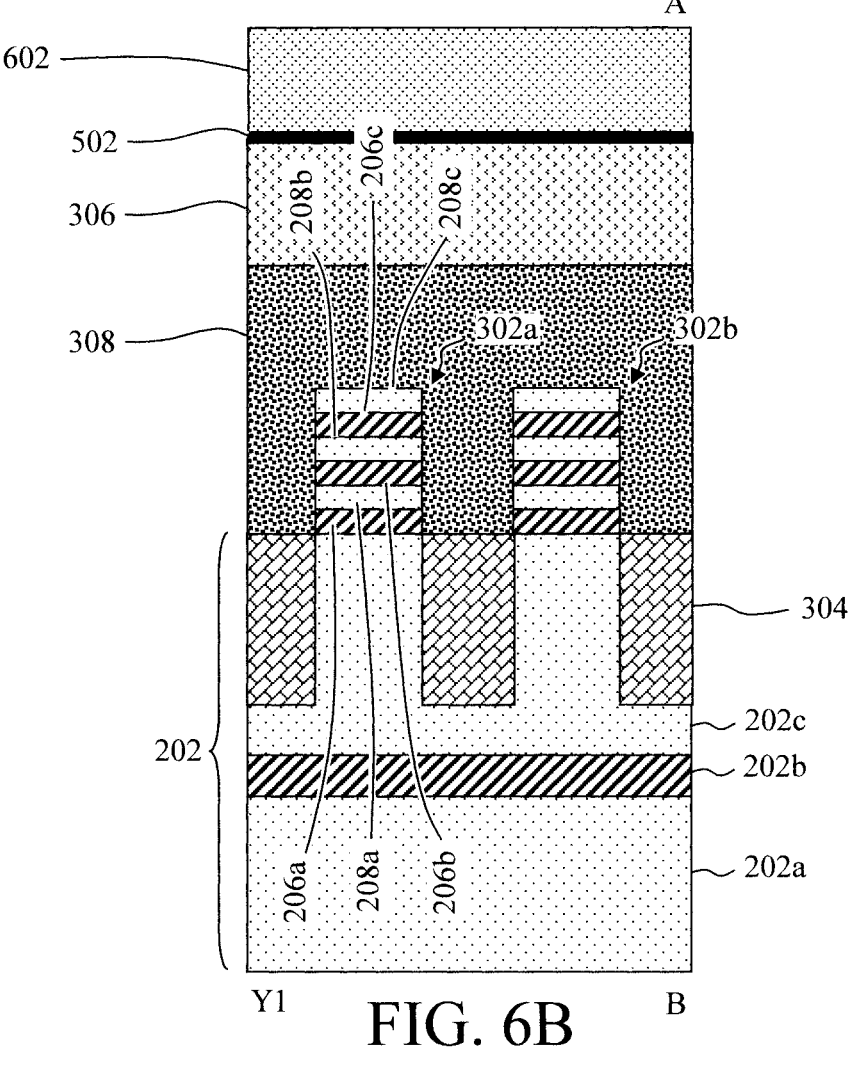
FIG. 6B is a Y1 cross-sectional view.

At least a select one of the first/shallow trenches 404 is then extended deeper into the semiconductor layer 202c to eventually enable the formation of self-aligned backside contacts to one or more of source/drain regions of the semiconductor device. To do so, as shown in FIG. 6A (an X cross-sectional view), FIG. 6B (a Y1 cross-sectional view) and FIG. 6C (a Y2 cross-sectional view), a fill material 602 is first deposited onto the protective layer 502 over the device stacks 302a,b, etc. and sacrificial gate hardmasks 306/sacrificial gates 308/dielectric spacers 402, at least one opening 604 is patterned in the fill material 602 over the select first/shallow trench 404 that is to be extended deeper into the semiconductor layer 202c, and the fill material 602 is removed from the select first/shallow trench 404. Suitable fill materials 602 include, but are not limited to, organic planarizing layer materials, which can be deposited using a casting process such as spray coating or spin casting. Standard lithography and etching techniques (see above) can be employed to pattern the opening 604 in fill material 602, and to remove the fill material 602 from the select first/shallow trenches 404 beneath the opening 604. As shown for example in FIG. 6A, perfect alignment of the opening 604 and the select first/shallow trench 404 is not needed so long as the opening 604 does not expose multiple first/shallow trenches 404.

Figures 6C, 7:
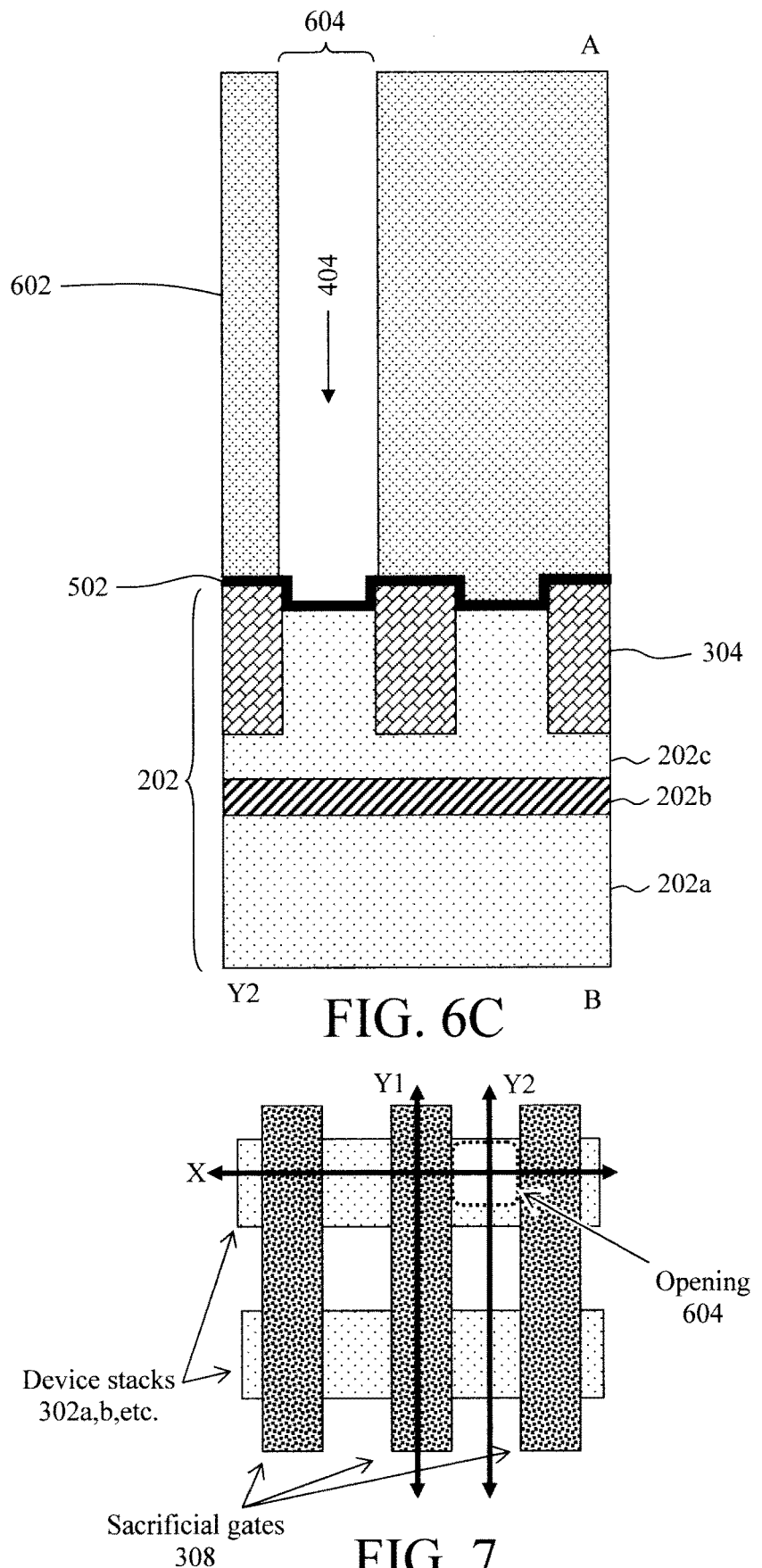
FIG. 6C is a Y2 cross-sectional view illustrating a fill material having been deposited onto the protective layer, an opening having been patterned in the fill material over at least a select one of the first/shallow trenches that will be extended deeper into the semiconductor layer, and the fill material having been removed from the select first/shallow trench according to an embodiment of the present invention.
FIG. 7 is a top-down diagram illustrating a positioning of the opening relative to the device stacks and the sacrificial gates according to an embodiment of the present invention.

For clarity, a top-down diagram is provided in FIG. 7 to illustrate the positioning of the opening 604 relative to the device stacks 302a,b, etc. and sacrificial gates 308. The fill material 602 is not shown in FIG. 7 in order to depict the underlying structures. Notably, the opening 604 is present between two of the sacrificial gates 308 over one of the device stacks, i.e., in this example, device stack 302a.

Figure 8A:
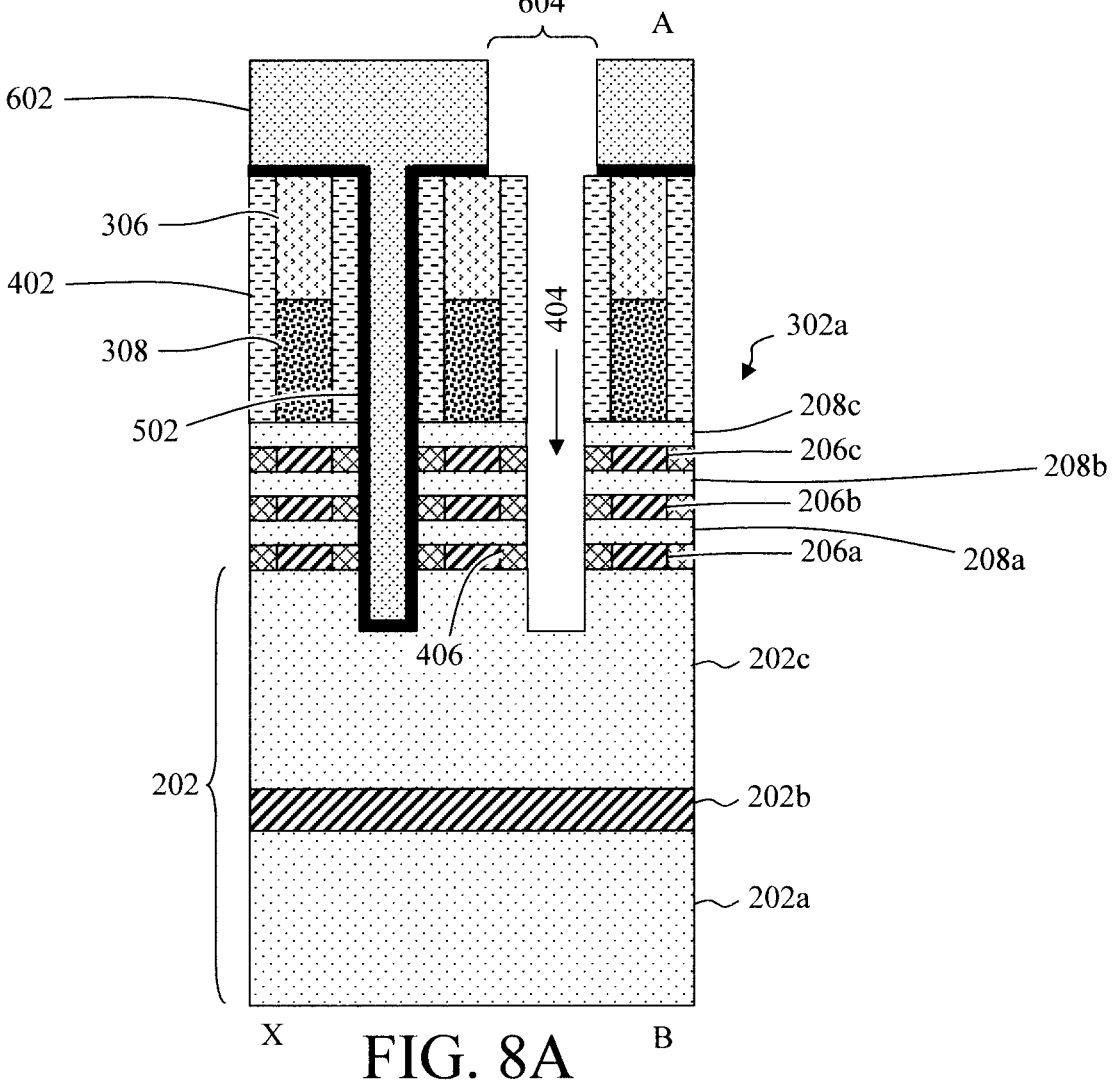
FIG. 8A is an X cross-sectional view.
Figure 8B:
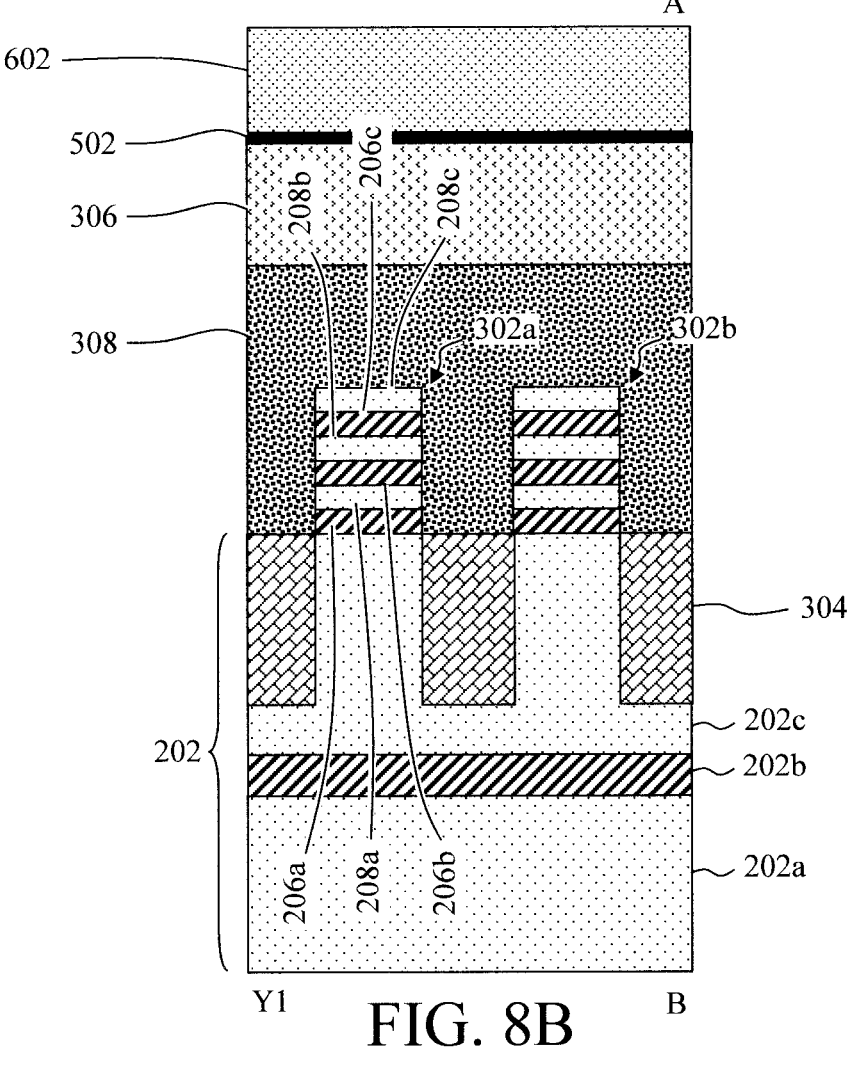
FIG. 8B is a Y1 cross-sectional view.
Figure 8C:
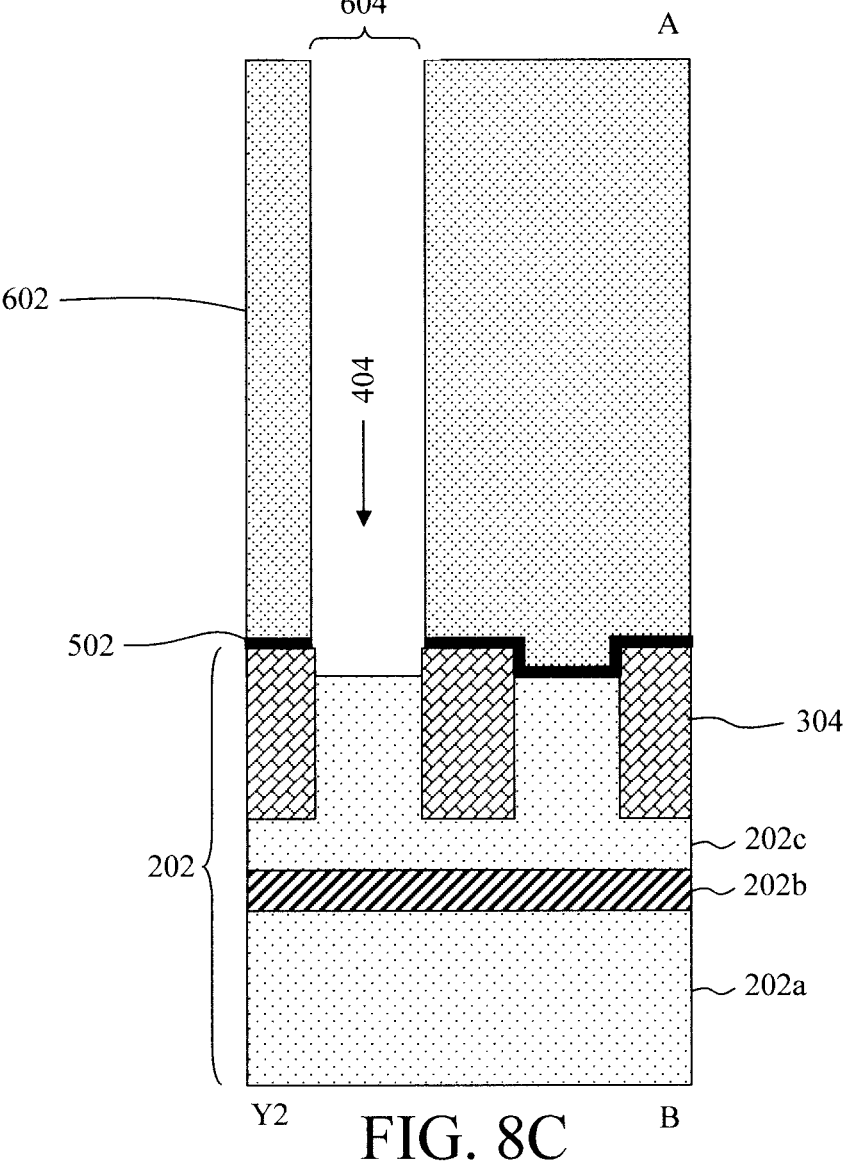
FIG. 8C is a Y2 cross-sectional view illustrating the protective layer having been removed from the select first/shallow trench through the opening in the fill material according to an embodiment of the present invention.

As shown in FIG. 8A (an X cross-sectional view), FIG. 8B (a Y1 cross-sectional view) and FIG. 8C (a Y2 cross-sectional view), the protective layer 502 is then removed from the select first/shallow trench 404 through the opening 604 in the fill material 602. To look at it another way, the protective layer 502 uncovered during formation of the opening 604 and removal of the fill material 602 from the select first/shallow trench 404 is etched away in this step. As provided above, the protective layer 502 can be formed from a nitride material such as SiN and/or SiON. In that case, a nitride-selective etch can be employed to remove the protective layer 502 from the select first/shallow trench 404.

Figure 9A:
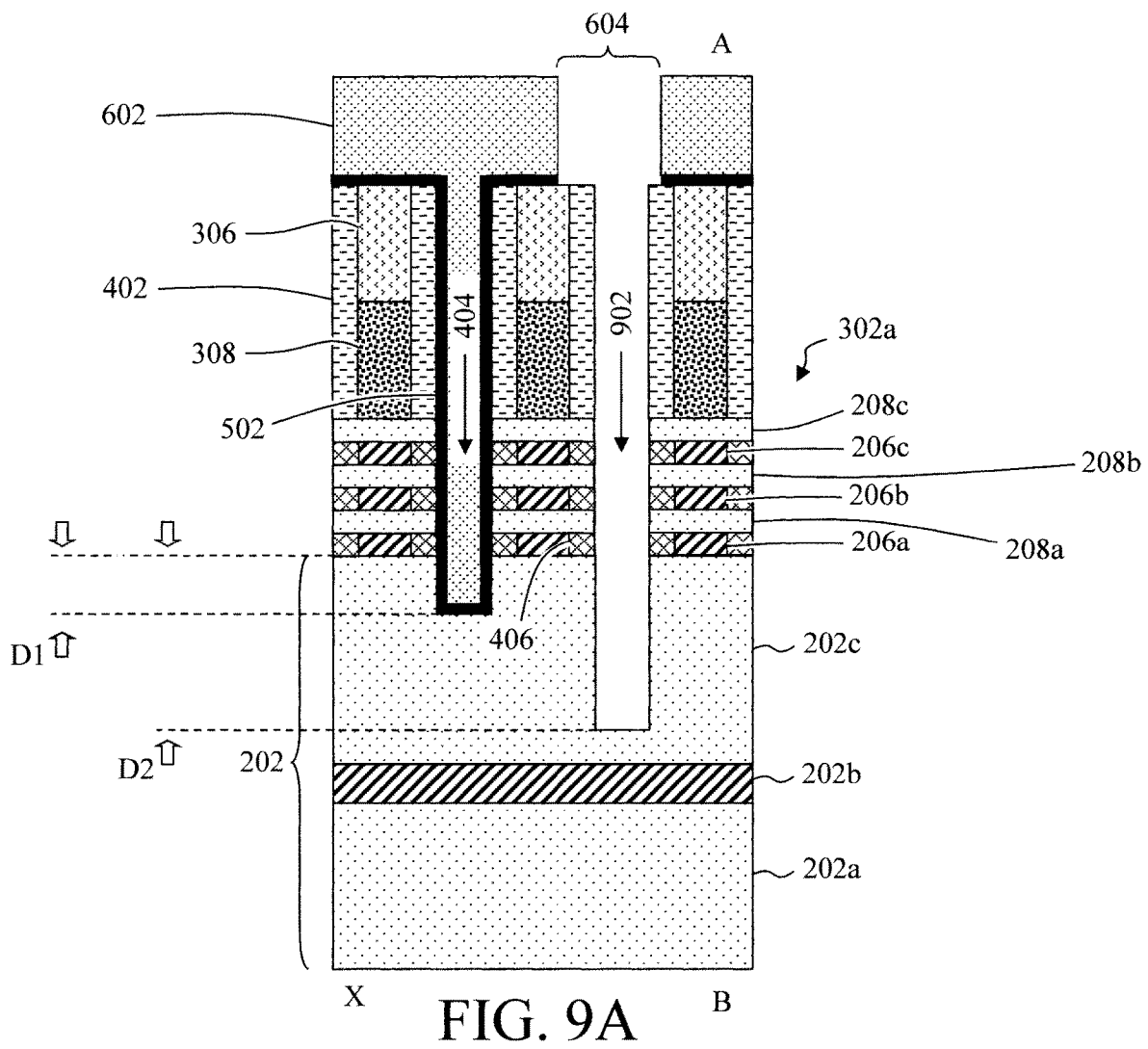
FIG. 9A is an X cross-sectional view.
Figure 9B:
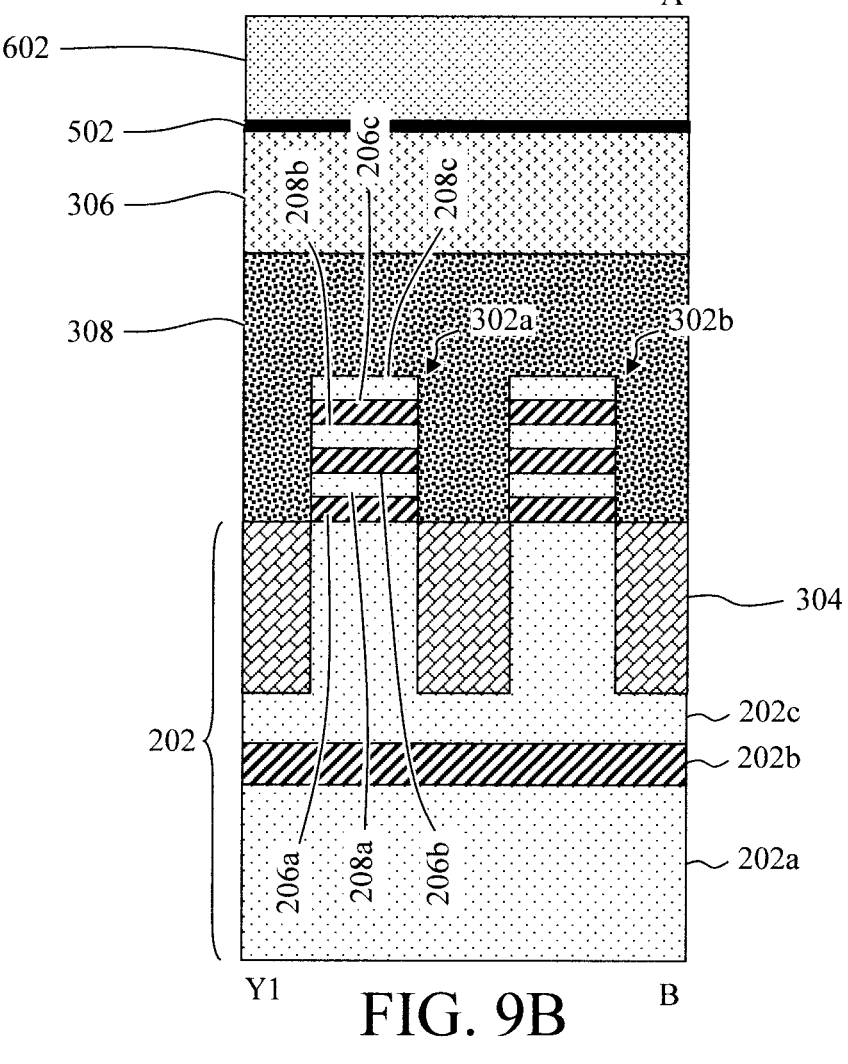
FIG. 9B is a Y1 cross-sectional view.
Figure 9C:
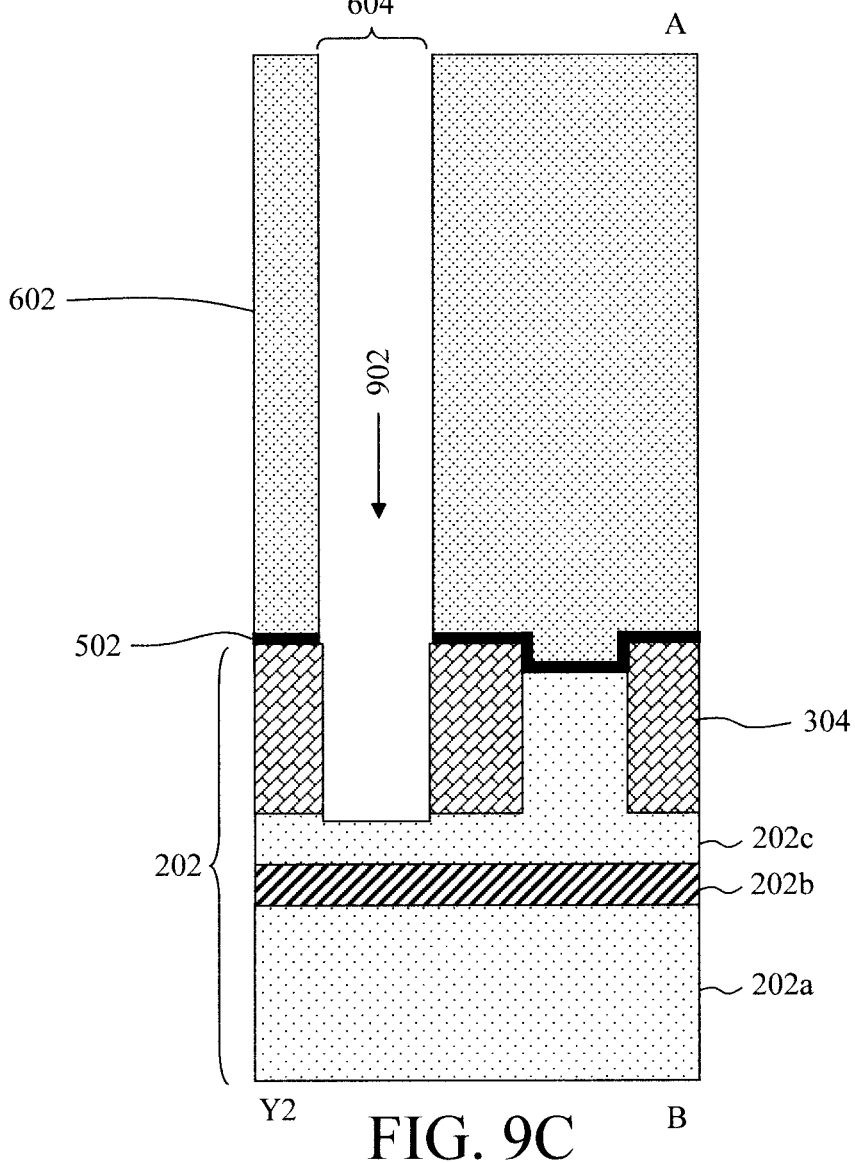
FIG. 9C is a Y2 cross-sectional view illustrating the select first/shallow trench having been extended deeper into the semiconductor layer forming at least one second/deep trench according to an embodiment of the present invention.

As shown in FIG. 9A (an X cross-sectional view), FIG. 9B (a Y1 cross-sectional view) and FIG. 9C (a Y2 cross-sectional view), the select first/shallow trench 404 is then extended deeper into the semiconductor layer 202c forming at least one second/deep trench 902. A directional (anisotropic) etching process such as reactive ion etching can be employed for this etch extension to form the second/deep trench 902. The rest of the first/shallow trenches 404 are protected from the etch by the protective layer 502/fill material 602, and thus remain at their original (shallow) depth. Namely, as shown in FIG. 9A, there are now first/second trenches 404 (currently filled with the protective layer 502 and fill material 602) and 902 at two different depths D1 and D2 in the semiconductor layer 202c, where D1 (shallow) is less than (<) D2 (deep). It is notable, however, that the second/deep trench 902 does not extend beyond semiconductor layer 202c. Namely, a portion of the semiconductor layer 202c remains at the bottom of the second/deep trench 902 separating the second/deep trench 902 from the etch stop layer 202b.

Figure 10A:
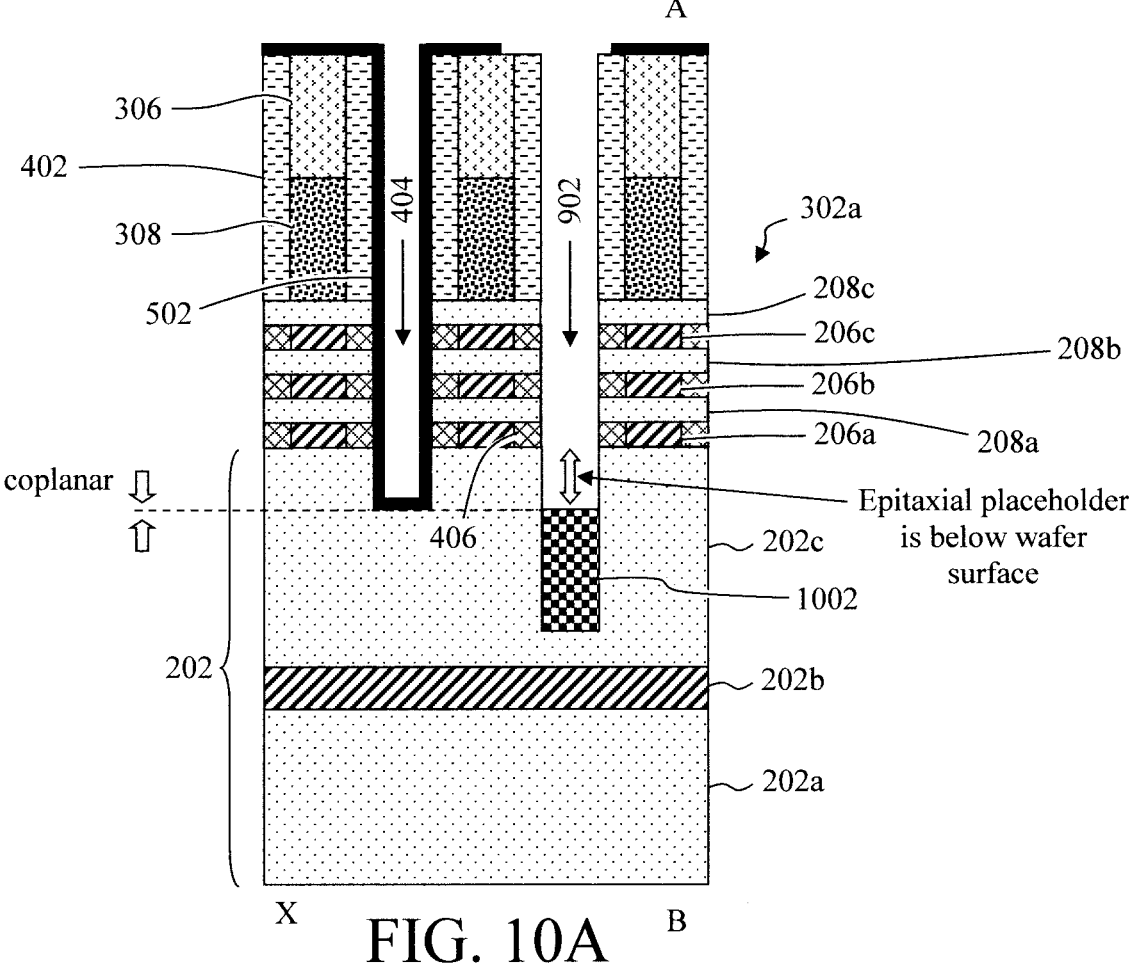
FIG. 10A is an X cross-sectional view.
Figure 10B:
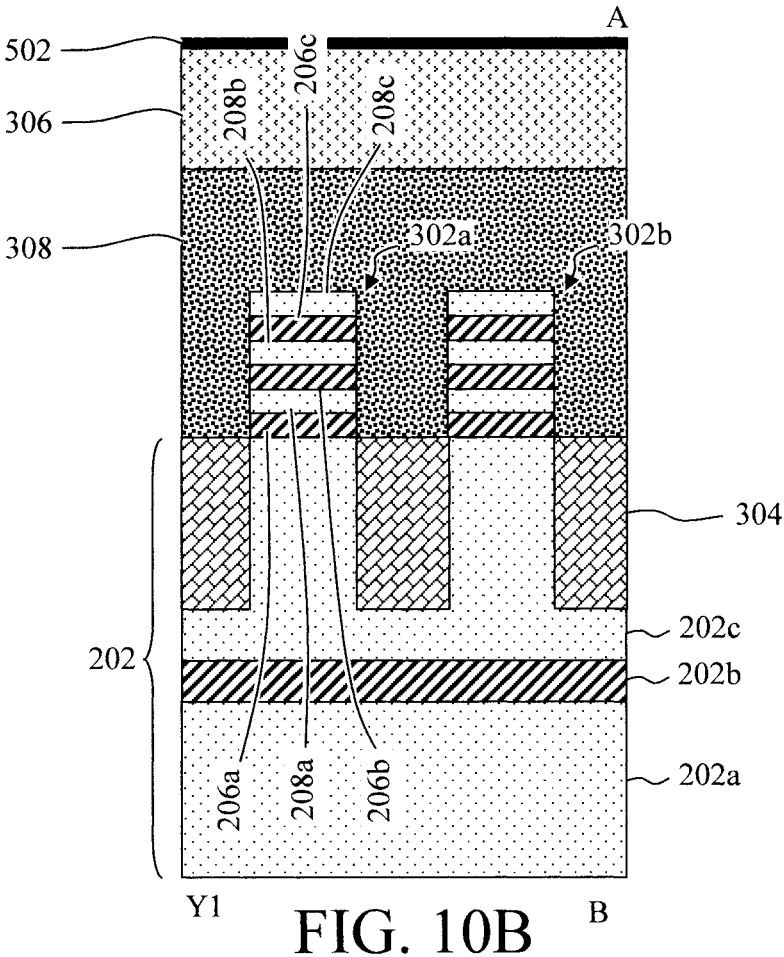
FIG. 10B is a Y1 cross-sectional view.
Figure 10C:
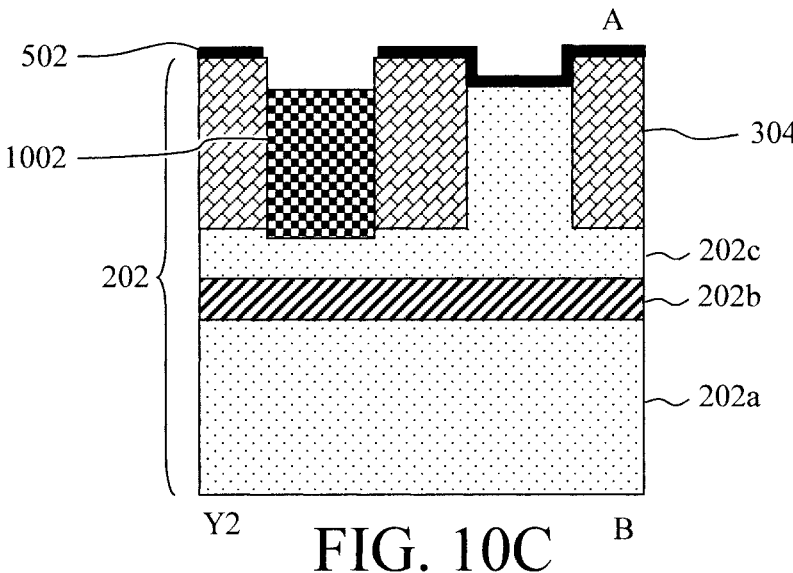
FIG. 10C is a Y2 cross-sectional view illustrating the fill material having been removed, and a (first) epitaxial placeholder having been grown in the second/deep trench according to an embodiment of the present invention.

As shown in FIG. 10A (an X cross-sectional view), FIG. 10B (a Y1 cross-sectional view) and FIG. 10C (a Y2 cross-sectional view), the fill material 602 is then removed, and an epitaxial contact placeholder 1002 is grown up from the semiconductor layer 202c in the second/deep trench 902. As provided above, the fill material 602 can be an organic planarizing layer material. In that case, the fill material 602 can be removed using a process such as ashing.

As its name indicates, epitaxial contact placeholder 1002 will later be removed and replaced with a self-aligned backside contact that directly contacts a source/drain region of the semiconductor device. Suitable materials for contact placeholder 1002 include, but are not limited to, epitaxial SiGe and/or epitaxial III-V materials. According to an exemplary embodiment, contact placeholder 1002 is formed from epitaxial SiGe having from about 15% Ge to about 60% Ge such as SiGe30. Epitaxial growth of the contact placeholder 1002 will occur on all exposed surfaces of the wafer 202. However, with the protective layer 502 still present over and lining the first/shallow trenches 404, the only exposed surfaces of the wafer 202 are the portions of the semiconductor layer 202c at the bottom of the second/deep trench 902. It is notable that a top surface of the as-deposited epitaxial contact placeholder 1002 is below a top surface of the semiconductor layer 202c. Furthermore, in one exemplary embodiment, the top surface of the as-deposited epitaxial contact placeholder 1002 is coplanar with a bottom of the first/shallow trenches 404.

Figure 11A:
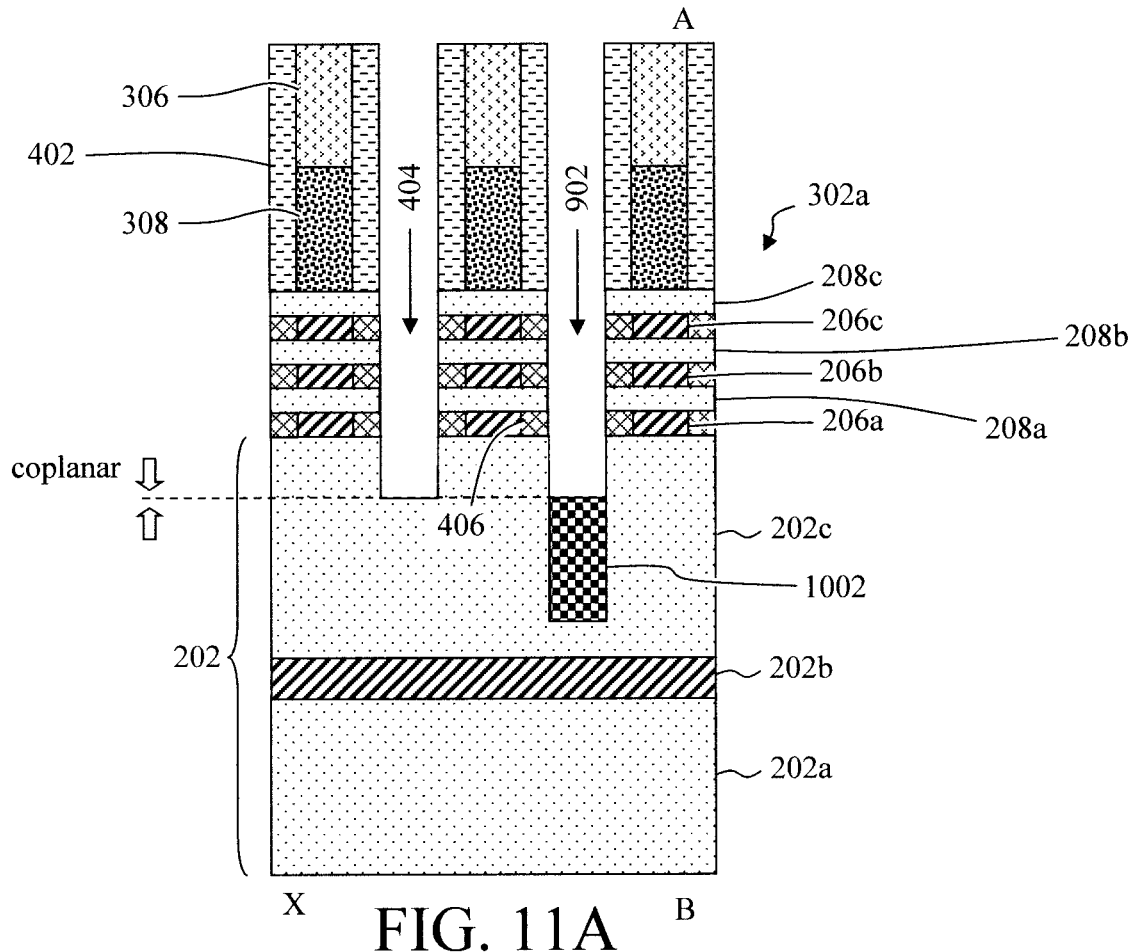
FIG. 11A is an X cross-sectional view.
Figure 11B:
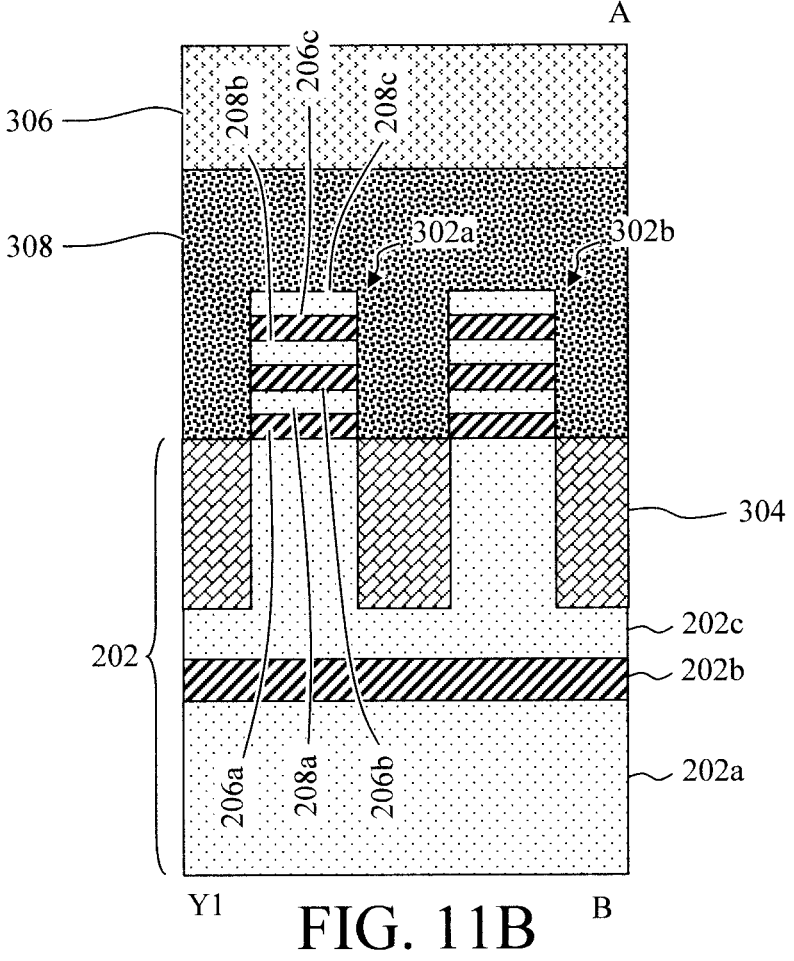
FIG. 11B is a Y1 cross-sectional view.
Figure 11C:
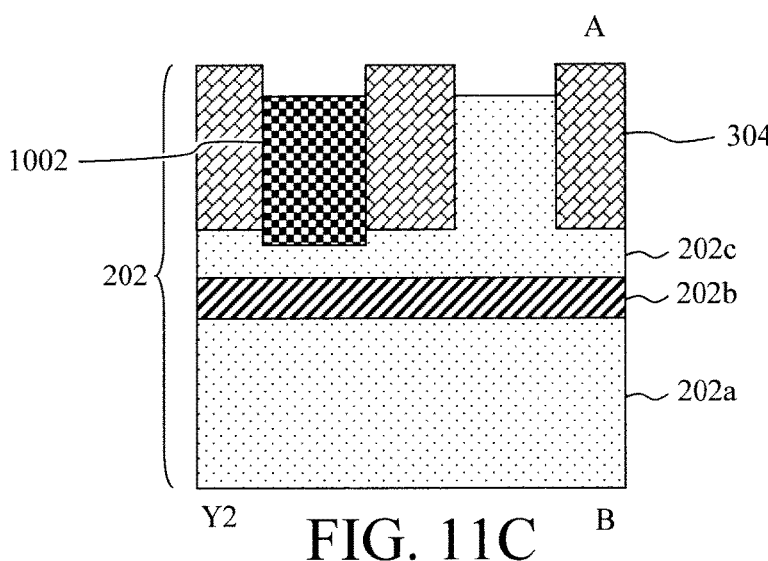
FIG. 11C is a Y2 cross-sectional view illustrating what remains of the protective layer having been removed according to an embodiment of the present invention.

As shown in FIG. 11A (an X cross-sectional view), FIG. 11B (a Y1 cross-sectional view) and FIG. 11C (a Y2 cross-sectional view), what remains of the protective layer 502 is then removed. As provided above, the protective layer 502 can be formed from a nitride material such as SiN and/or SiON. In that case, a nitride-selective etch can be employed to remove the remaining protective layer 502.

Figure 12A:
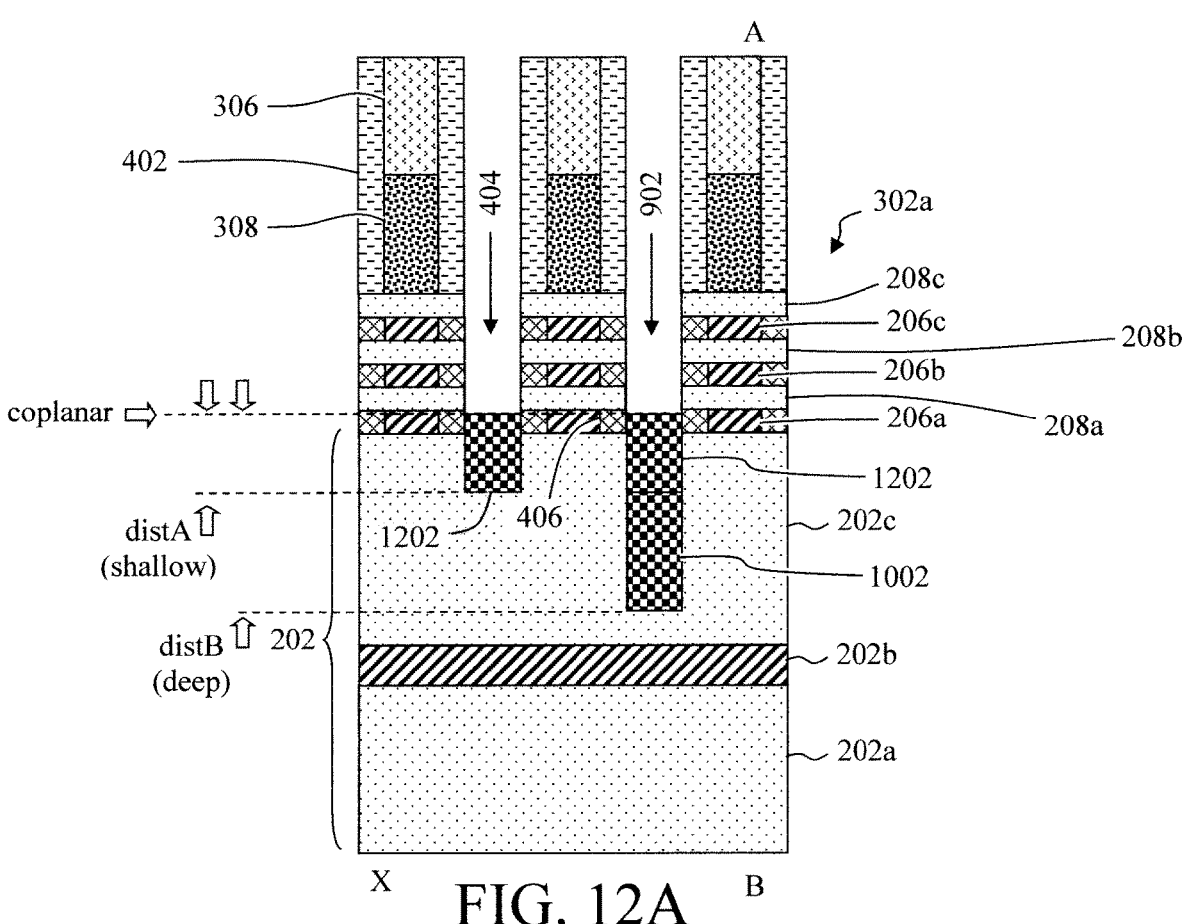
FIG. 12A is an X cross-sectional view.
Figure 12B:
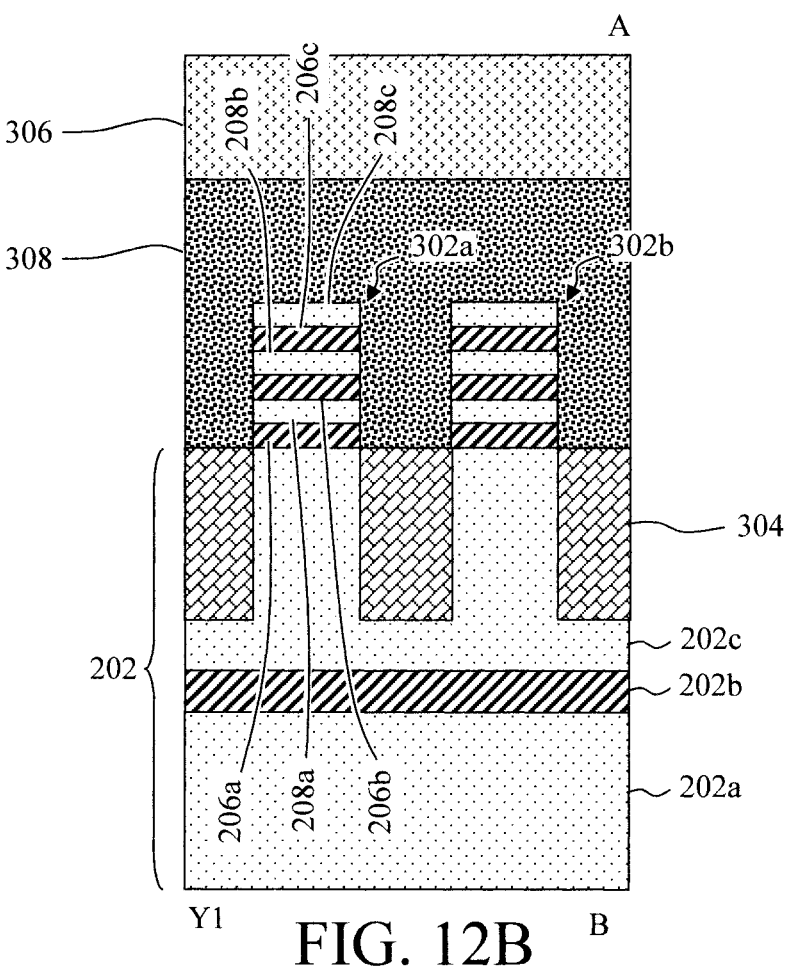
FIG. 12B is a Y1 cross-sectional view.
Figure 12C:
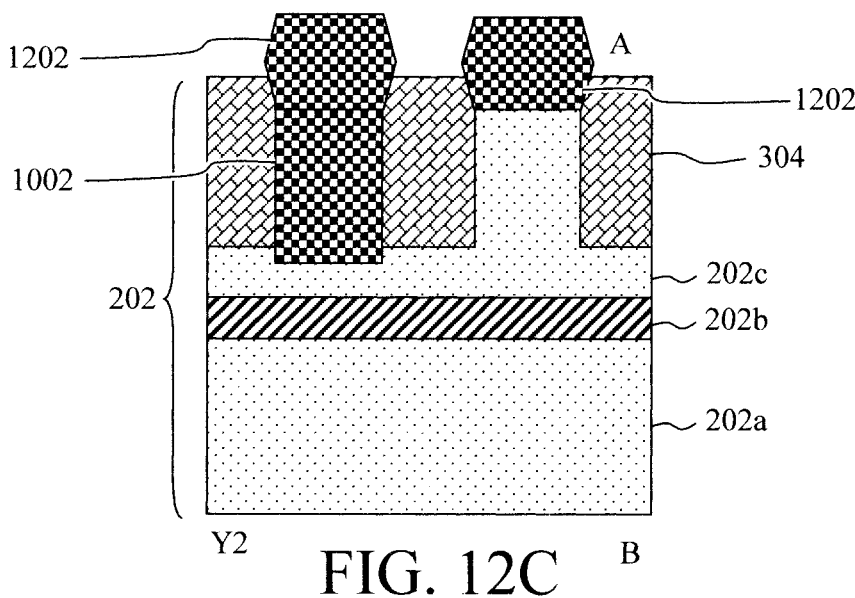
FIG. 12C is a Y2 cross-sectional view illustrating a (second) epitaxial contact placeholder having been grown up from the semiconductor layer in the first/shallow trenches, and up from the first epitaxial contact placeholder in the second/deep trench according to an embodiment of the present invention.

Removal of the remaining protective layer 502 exposed the semiconductor layer 202c at the bottom of the first/shallow trenches 404. As shown in FIG. 12A (an X cross-sectional view), FIG. 12B (a Y1 cross-sectional view) and FIG. 12C (a Y2 cross-sectional view), an epitaxial contact placeholder 1202 is grown up from the semiconductor layer 202c in the first/shallow trench 404, and up from the epitaxial contact placeholder 1002 in the second/deep trench 902. For clarity, the terms 'first' and 'second' may also be used herein when referring to epitaxial contact placeholder 1002 and epitaxial contact placeholder 1202, respectively. Like epitaxial contact placeholder 1002, epitaxial contact placeholder 1202 will later be removed from the second/deep trench 902 and replaced with a self-aligned backside contact that directly contacts a source/drain region of the semiconductor device. Suitable materials for epitaxial contact placeholder 1202 include, but are not limited to, epitaxial SiGe and/or epitaxial III-V materials. According to an exemplary embodiment, epitaxial contact placeholder 1202 is formed from epitaxial SiGe having from about 15% Ge to about 60% Ge such as SiGe30. In one exemplary embodiment, a top surface of the epitaxial contact placeholder 1202 in the first/shallow trenches 404 is coplanar with the top surface of the epitaxial contact placeholder 1202 in the second/deep trench 902.

As shown, for example, in FIG. 12A the epitaxial contact placeholder 1202 in the first/shallow trenches 404 extends a first (shallow) distance distA into the semiconductor layer 202c, whereas the epitaxial contact placeholder 1002 in combination with the epitaxial contact placeholder 1202 in the second/deep trench 902 extends a second (deep) distance distB into the semiconductor layer 202c, where distA<distB.

Figure 13A:
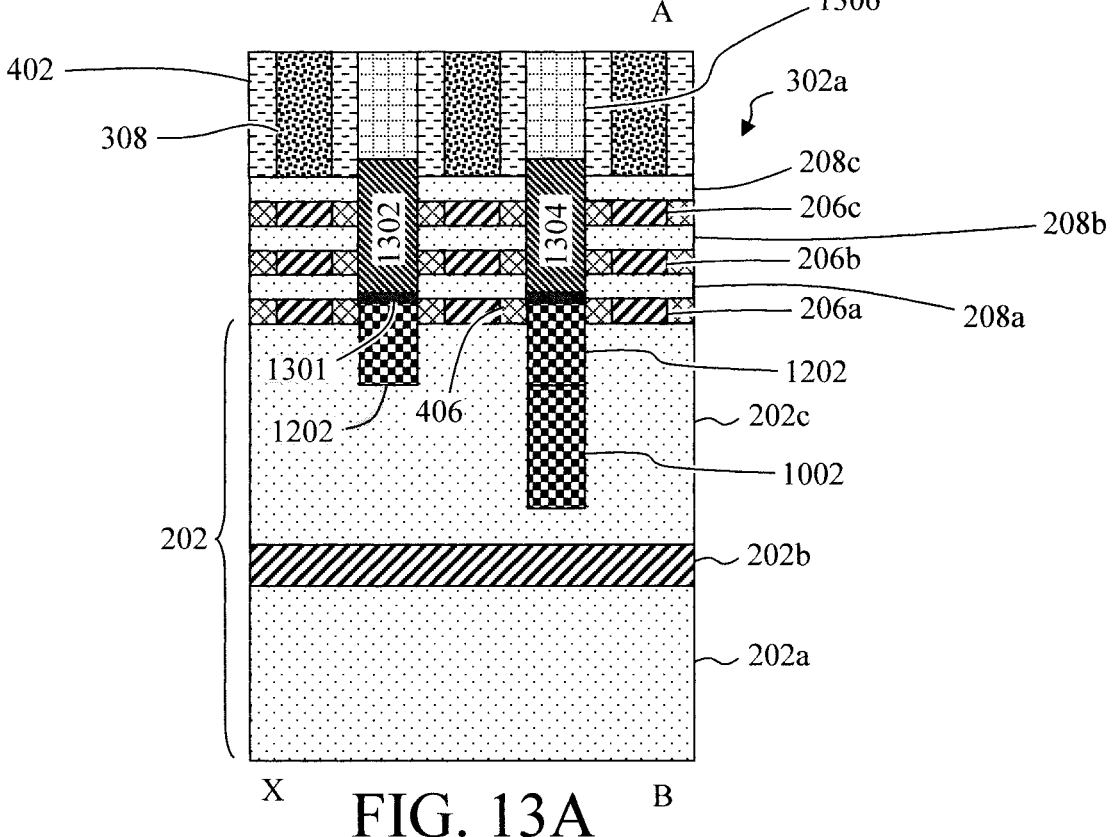
FIG. 13A is an X cross-sectional view.
Figure 13B:
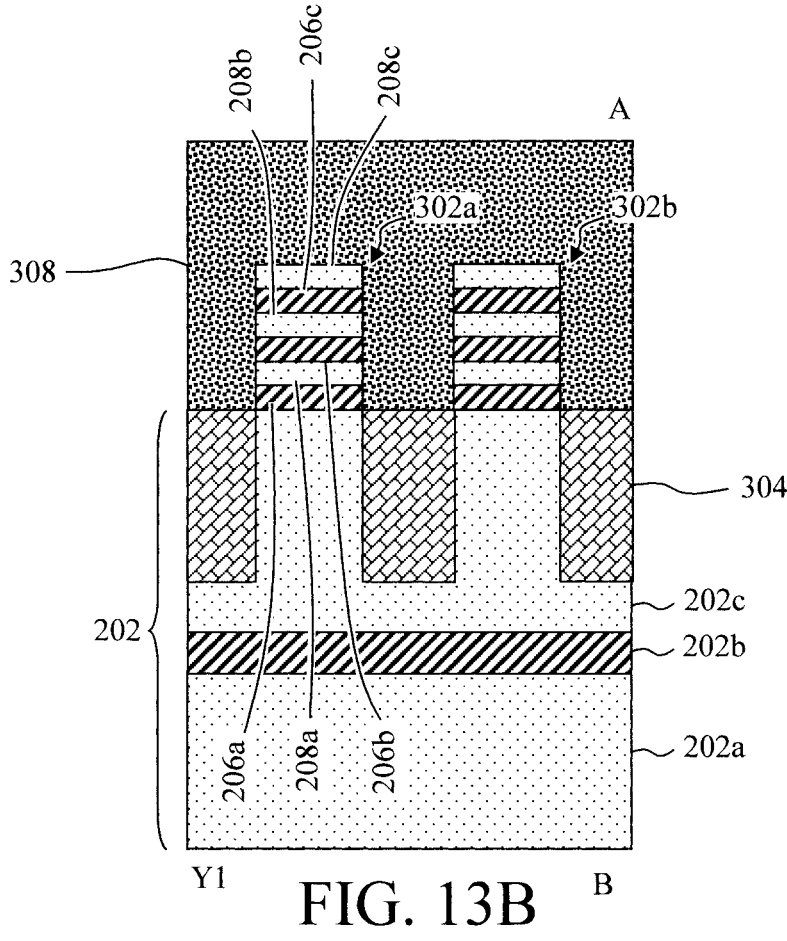
FIG. 13B is a Y1 cross-sectional view.
Figure 13C:
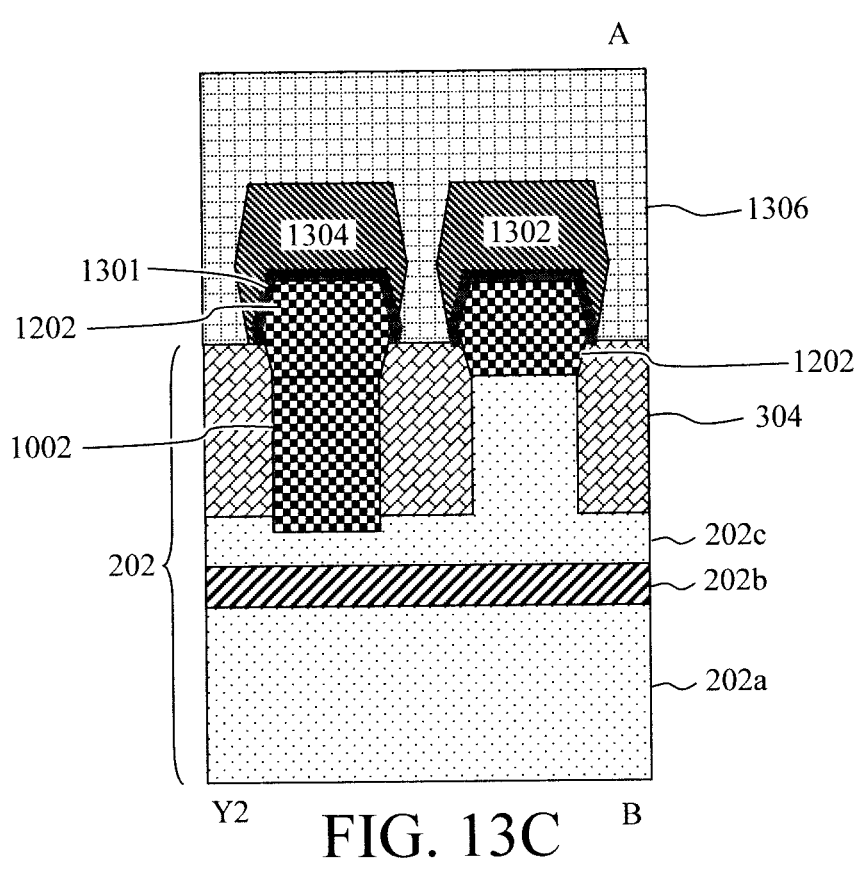
FIG. 13C is a Y2 cross-sectional view illustrating first/second source/drain regions having been formed in the first/shallow and the second/deep trenches, respectively, over and in direct contact with the second epitaxial contact placeholder, and an interlayer dielectric having been deposited over the first/second source/drain regions according to an embodiment of the present invention.

As shown in FIG. 13A (an X cross-sectional view), FIG. 13B (a Y1 cross-sectional view) and FIG. 13C (a Y2 cross-sectional view), first/second source/drain regions 1302 and 1304 of the semiconductor device are next formed in the first/shallow and second/deep trenches 404 and 902, respectively, over and in direct contact with the epitaxial contact placeholders 1202 which, in the second/deep trench 902 is present over and in direct contact with the epitaxial contact placeholder 1002, and an interlayer dielectric 1306 is deposited over the first/second source/drain regions 1302 and 1304.

Specifically, first/second source/drain regions 1302 and 1304 are formed in the first/shallow and second/deep trenches 404 and 902 on opposite sides of the sacrificial gates 308 alongside the sacrificial layers 206a,b,c, etc. and active layers 208a,b,c, etc. As will be described in detail below, the (deep) epitaxial contact placeholders 1002 and 1202 will be removed selective to the second source/drain region 1304. In order to facilitate this selective removal process, a thin (e.g., from about 1 nm to about 2 nm) layer 1301 of, e.g., Si, is first grown on the epitaxial contact placeholders 1202 in the first/shallow and second/deep trenches 404 and 902 followed by the source/drain region epitaxy. According to an exemplary embodiment, the first/second source/drain regions 1302 and 1304 are each formed from an n-type or p-type in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B). As compared to conventional processes where growth of the source/drain region epitaxy is limited to the ends of the active layers, here bottom-up epitaxial growth from the epitaxial contact placeholders 1202 (which provide a pristine (100) crystallographic surface) is used to form the first/second source/drain regions 1302 and 1304 which advantageously results in very uniform, high-quality epitaxy with low defects.

Growing the first/second source/drain regions 1302 and 1304 on epitaxial contact placeholder 1202 and on epitaxial contact placeholders 1202/1002, respectively, is what is referred to herein as an 'epitaxy everywhere under source/drain region' approach. In other words, with this approach there is epitaxy (i.e., epitaxial contact placeholders 1002 and/or 1202) everywhere the source/drain regions 1302 or 1304 is being formed.

Suitable interlayer dielectric 1306 materials include, but are not limited to, silicon nitride (SiN), SiOC and/or oxide low-κ materials such as SiOx and/or oxide ULK-ILD materials such as pSiCOH, which can be deposited onto the semiconductor device structure using a process such as CVD, ALD or PVD. According to an exemplary embodiment, the interlayer dielectric 1306 is a different dielectric material from the shallow trench isolation regions 304 (e.g., interlayer dielectric 1306 can be SiN, and the shallow trench isolation regions 304 can be SiOx). Following deposition, the interlayer dielectric 1306 is planarized using a process such as chemical mechanical polishing. According to an exemplary embodiment, this chemical mechanical polishing serves to remove the sacrificial gate hardmasks 306 thereby exposing the underlying sacrificial gates 308.

Figure 14A:
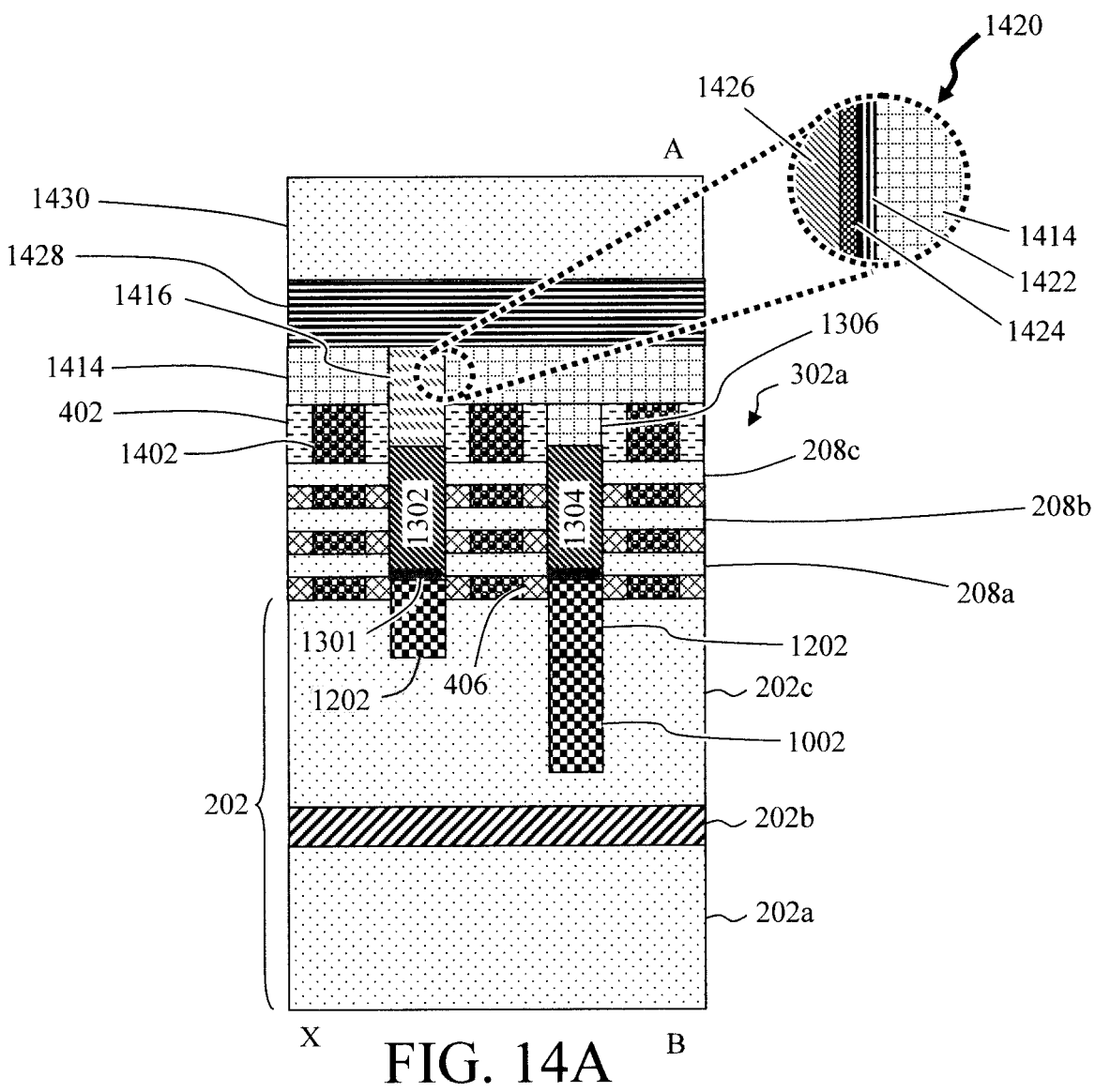
FIG. 14A is an X cross-sectional view.
Figure 14B:
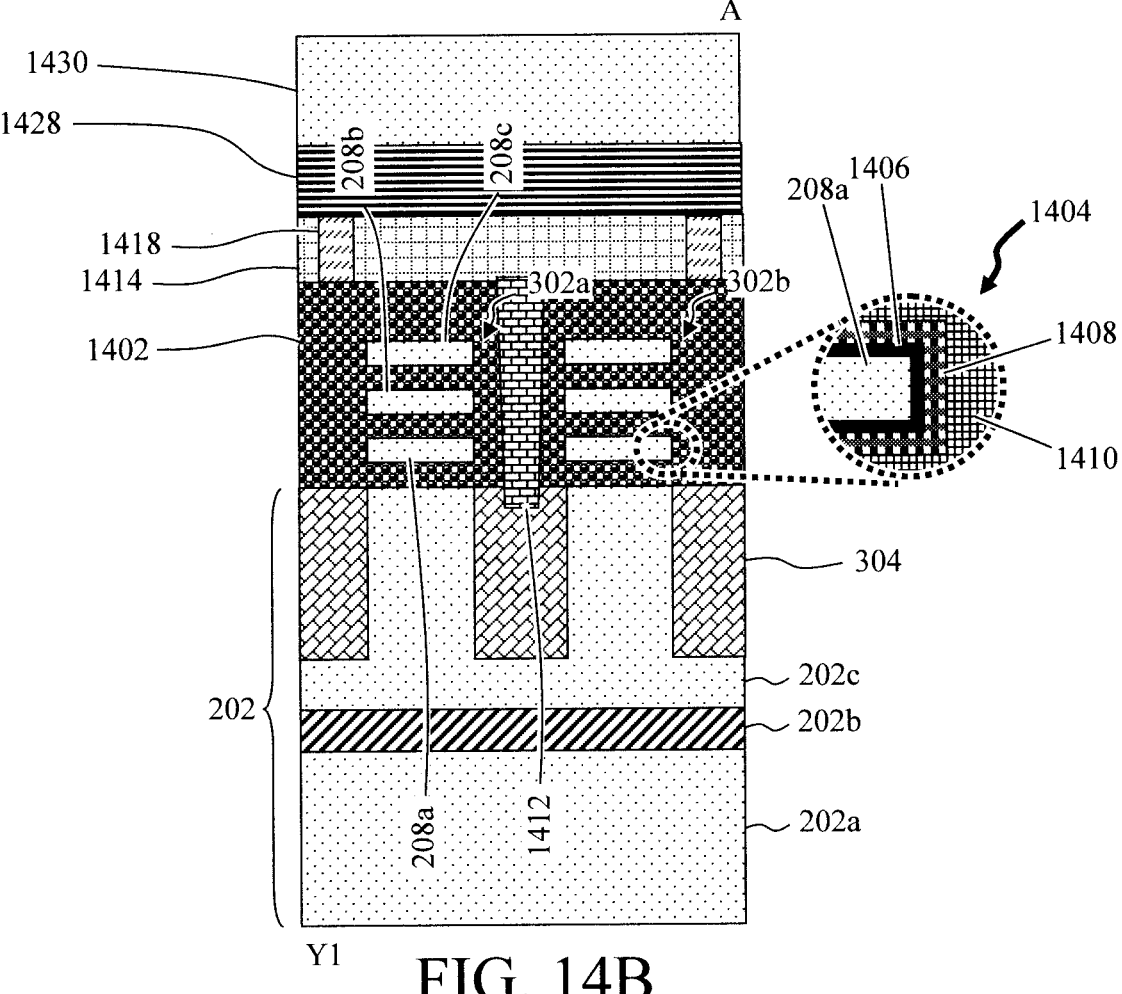
FIG. 14B is a Y1 cross-sectional view.
Figure 14C:
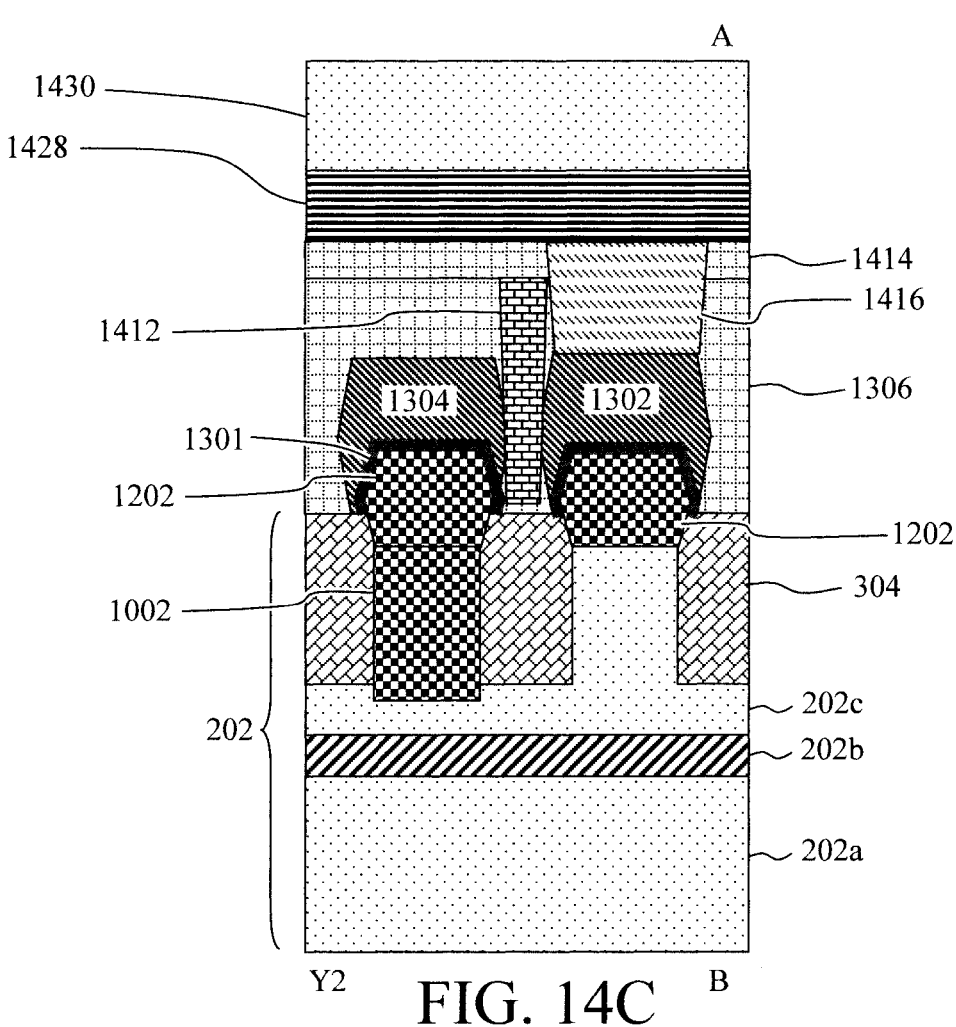
FIG. 14C is a Y2 cross-sectional view illustrating the sacrificial gates having been removed followed by the sacrificial layers, replacement gates having been formed surrounding each of the active layers in a gate-all-around configuration, gate cuts having been formed in the replacement gates, middle of line source/drain region contacts and gate contacts having been formed, followed by a back end of line interconnect layer, and the first side (A), i.e., frontside, of the wafer having been bonded to a carrier wafer according to an embodiment of the present invention.

As shown in FIG. 14A (an X cross-sectional view), FIG. 14B (a Y1 cross-sectional view) and FIG. 14C (a Y2 cross-sectional view), the sacrificial gates 308 are removed followed by the sacrificial layers 206a,b,c, etc., replacement gates 1402 are formed surrounding each of the active layers 208a,b,c, etc. in the device stacks 302a,b, etc. in a gate-all-around configuration, a gate cut 1412 is formed in the replacement gates 1402, middle of line source/drain region contacts 1416 and gate contacts 1418 are next formed, followed by a back end of line interconnect layer 1428, and bonding of the first side (A), i.e., frontside, of the wafer 202 (via back end of line interconnect layer 1428) to a carrier wafer 1430. Namely, as will be described in detail below, carrier wafer 1430 will enable backside processing, which includes the complete removal of wafer 202, the formation of the present self-aligned direct backside contact to the second source/drain region 1304, and formation of a backside power rail.

As provided above, sacrificial gates 308 can be formed from a material such as poly-silicon and/or amorphous silicon. In that case, a poly-silicon or amorphous silicon-selective etching process can be employed to remove the sacrificial gates 308. Removal of the sacrificial gates 308 exposes the underlying device stacks 302a,b, etc. which enables the selective removal of the sacrificial layers 206a, b,c, etc. According to an exemplary embodiment, sacrificial layers 206a,b,c, etc. are formed from SiGe, while active layers 208a,b,c, etc. are formed from Si. In that case, etchants such as wet hot SC1, vapor phase HCl, vapor phase ClF₃ and/or other reactive clean processes can be employed to remove the sacrificial layers 206a,b,c, etc., selective to the active layers 208a,b,c, etc. Removal of the sacrificial layers 206a,b,c, etc. releases the active layers 208a,b,c, etc. from the device stacks 302a,b, etc. These 'released' active layers 208a,b,c, etc. will serve as channels of the field-effect transistor(s) on the first side (A), i.e., frontside, of the wafer 202.

Replacement gates 1402 are then formed surrounding a portion of each of the active layers 208a,b,c, etc. in a gate-all-around configuration. The term 'gates' may also be used herein when referring to replacement gates 1402. Looking at magnified view 1404 in FIG. 14B, according to an exemplary embodiment, formation of the replacement gates 1402 begins with the deposition of a (conformal) gate dielectric 1406 onto/surrounding each of the active layers 208a,b,c, etc. According to an exemplary embodiment, the gate dielectric 1406 is a high-κ material. The term "high-κ," as used herein, refers to a material having a relative dielectric constant κ which is much higher than that of silicon dioxide (e.g., a dielectric constant κ=25 for hafnium oxide (HfO₂) rather than 4 for SiO₂). Suitable high-κ gate dielectrics include, but are not limited to, hafnium oxide (HfO₂) and/or lanthanum oxide (La₂O₃). A process such as CVD, ALD or PVD can be employed to deposit the gate dielectric 1406. According to an exemplary embodiment, gate dielectric 1406 has a thickness of from about 1 nanometer (nm) to about 5 nm and ranges therebetween. A reliability anneal can be performed following deposition of the gate dielectric 1406. In one exemplary embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as, but not limited to, nitrogen.

At least one workfunction-setting metal 1408 is then deposited over the gate dielectric 1406. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. A process such as CVD, ALD or PVD can be employed to deposit the workfunction-setting metal (s) 1408, after which the metal overburden can be removed using a process such as chemical mechanical polishing.

Optionally, a (low-resistance) fill metal 1410 can be deposited over the workfunction-setting metal(s) 1408 so as to fill in any remaining spaces in the replacement gates 1402. Suitable low-resistance fill metals 1410 include, but are not limited to, W, cobalt (Co), ruthenium (Ru) and/or Al which can be deposited using a process or combination of processes including, but not limited to, CVD, ALD, PVD, sputtering, plating, evaporation, ion beam deposition, electron beam deposition, laser assisted deposition, chemical solution deposition, etc.

As shown in FIGS. 14A-C, a plurality of field-effect transistors is now present on the first side (A), i.e., frontside, of the wafer 202. Each of the field-effect transistors includes a stack of the active layers 208a,b,c, etc., a replacement gate 1402 (or simply a 'gate') surrounding the active layers 208a,b,c, etc. in a gate-all-around configuration, and first/ second source/drain regions 1302 and 1304 on opposite sides of the stack of active layers 208a,b,c, etc.

To form the gates cut 1412, a gate cut opening is created in the replacement gates 1402 between adjacent device stacks 302a,b, etc. Standard lithography and etching techniques (see above) can be employed to pattern the gate cut opening in the replacement gates 1402. The gate cut opening is then filled with a gate cut dielectric material to form the gate cut 1412 which will serve to isolate the gates of different field-effect transistors. Thus, what is visible as the gate cut 1412 in the figures is the gate cut dielectric material. Suitable gate cut dielectric materials include, but are not limited to, SiN, SiOx, SiC and/or SiCO, which can be deposited into the gate cut opening using a process such as CVD, ALD or PVD. Following deposition, the excess gate cut dielectric material can be removed using a process such as chemical mechanical polishing.

To form the middle of line source/drain region and gate contacts 1416 and 1418, an interlayer dielectric 1414 is first deposited onto the interlayer dielectric 1306 over the semiconductor device structure. For clarity, the terms 'first' and 'second' may also be used herein when referring to interlayer dielectric 1306 and interlayer dielectric 1414, respectively. Suitable interlayer dielectric 1414 materials include, but are not limited to, SiN, SiOC and/or oxide low-κ materials such as SiOx and/or oxide ULK-ILD materials such as pSiCOH, which can be deposited using a process such as CVD, ALD or PVD. Following deposition, the interlayer dielectric 1414 can be planarized using a process such as chemical mechanical polishing.

Standard lithography and etching techniques (see above) are then used to pattern trenches in the interlayer dielectrics 1306/1414 over first source/drain region 1302, and over the replacement gates 1402, followed by metallization to form the middle of line source/drain region contacts 1416 and gate contacts 1418, respectively.

Looking at magnified view 1420 in FIG. 14A, the metallization can include first depositing a silicide liner 1422 into and lining the trenches, depositing a metal adhesion layer 1424 onto the silicide liner 1422, and then depositing a fill metal 1426 onto the metal adhesion layer 1424. Suitable silicide liner 1422 materials include, but are not limited to, titanium (Ti), nickel (Ni) and/or nickel platinum (NiPt), which can be deposited using a process such as CVD, ALD or PVD. According to an exemplary embodiment, silicide liner 1422 has a thickness of from about 1 nm to about 5 nm. Suitable metal adhesion layer 1424 materials include, but are not limited to, TiN and/or TaN, which can be deposited onto the silicide liner 1422 using a process such as CVD, ALD or PVD. According to an exemplary embodiment, metal adhesion layer 1424 has a thickness of from about 1 nm to about 5 nm. Suitable fill metals 1426 include, but are not limited to, W, Co, Ru and/or Al, which can be deposited onto the metal adhesion layer 1424 using a process such as CVD, ALD, PVD, sputtering, plating, evaporation, ion beam deposition, electron beam deposition, laser assisted deposition, chemical solution deposition, etc. Following deposition, the overburden can be removed using a process such as chemical mechanical polishing. While magnified view 1420 is of one of the middle of line source/drain region contacts 1416, it is to be understood that the middle of line gate contacts 1418 can have the same above-described configuration and be formed in the same manner as the middle of line source/drain region contacts 1416.

Back end of line interconnect layer 1428 generally includes interconnect structures commonly formed in the back end of line during semiconductor device fabrication. Namely, in the back end of line, individual devices such as transistors are interconnected through a series of metal layers. For instance, conductive structures like vias and metal lines can be employed to connect a device to one or more other devices, with the metal lines making lateral connections and the vias making vertical connections amongst different metallization levels. Standard metallization techniques can be employed to form the back end of line interconnect layer 1428. While the individual interconnect structures present in back end of line interconnect layer 1428 are not specifically shown in the figures, it would be apparent to one skilled in the art how such a back end of line interconnect layer 1428 is implemented for a given semiconductor device application.

Carrier wafer 1430 is then bonded to the first side (A), i.e., frontside, of wafer 202 over back end of line interconnect layer 1428. Suitable carrier wafers include, but are not limited to, silicon, silicon carbide and/or glass wafers. As will be described in detail below, carrier wafer 1430 will enable the backside processing needed to form the present self-aligned direct backside contact to the second source/drain region 1304 and a backside power rail.

Figure 15:
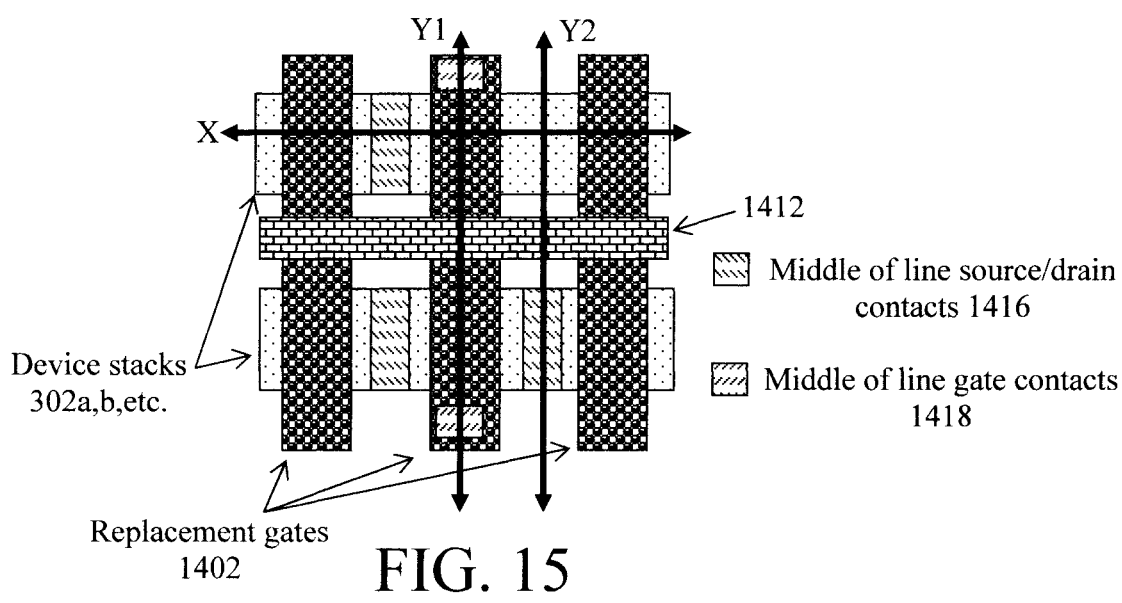
FIG. 15 is a top-down diagram illustrating an orientation of the gate cuts across the replacement gates, and a positioning of the middle of line source/drain contacts and the middle of line gate contacts according to an embodiment of the present invention.

For clarity, a top-down diagram is provided in FIG. 15 to illustrate the orientation of the gate cut 1412 along the replacement gates 1402, and the positioning of the middle of line source/drain contacts 1416 and middle of line gate contacts 1418. As shown in FIG. 15, the gate cut 1412 is present across each of the replacement gates 1402.

Processing now turns to the second side (B), i.e., backside, of the wafer 202. As would be apparent to one skilled in the art, this backside processing often involves flipping wafer 202 over to enable top-down fabrication, with carrier wafer 1430 serving as the bottom-most supporting substrate. With that in mind, the orientation of the present semiconductor device is not shown flipped or rotated in the figures merely for the sake of clarity, i.e., so that the orientation of the structures can be depicted in a consistent manner throughout the figures. However, this does not mean that wafer 202 is not flipped during fabrication.

Figure 16A:
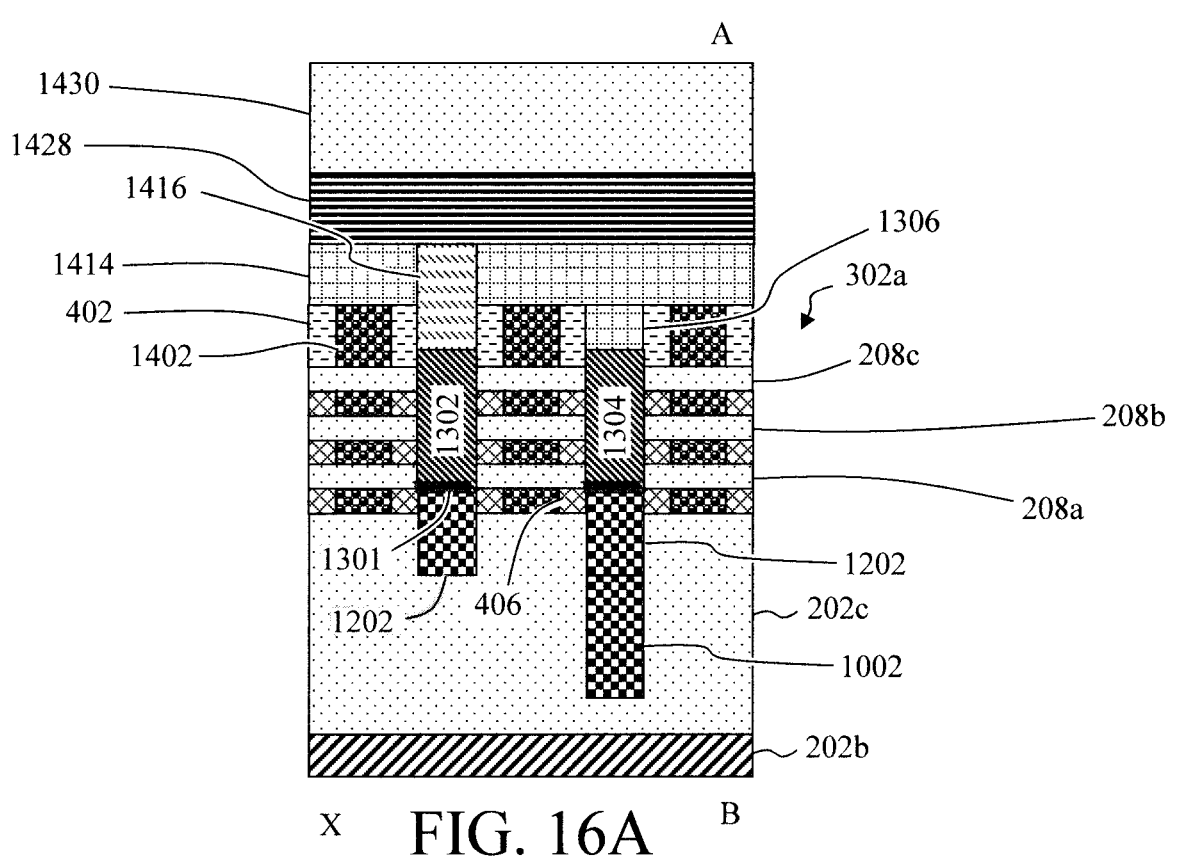
FIG. 16A is an X cross-sectional view.
Figure 16B:
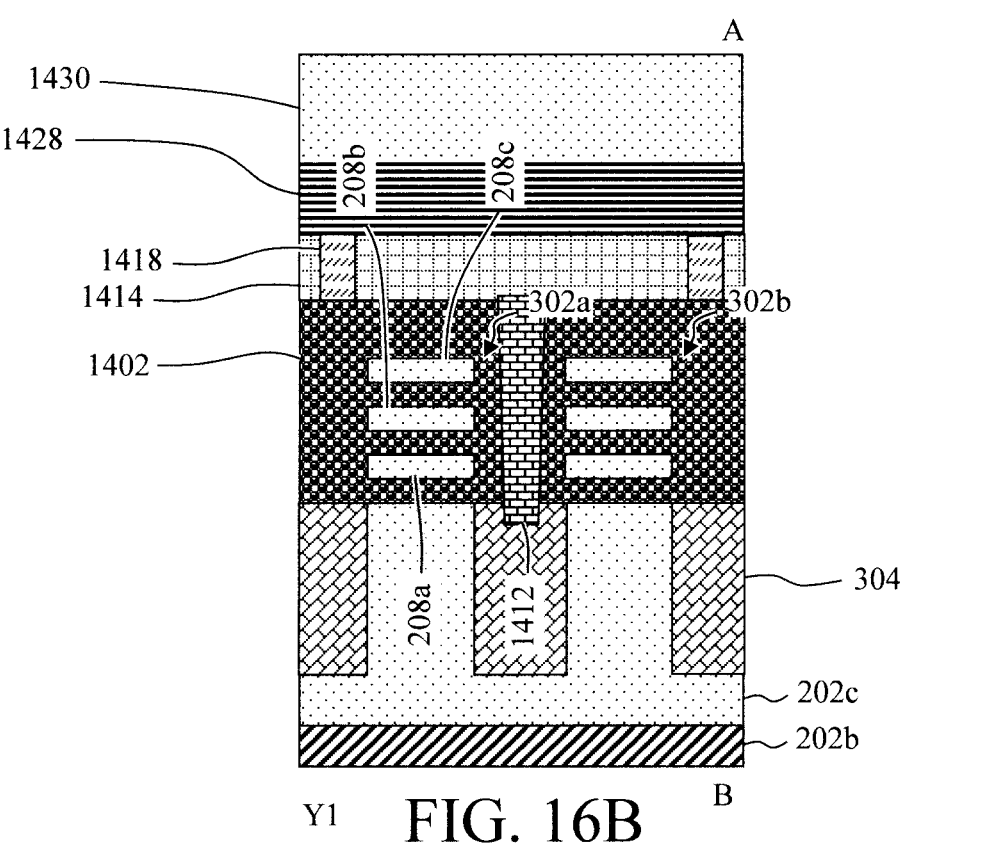
FIG. 16B is a Y1 cross-sectional view.

As shown in FIG. 16A (an X cross-sectional view), FIG. 16B (a Y1 cross-sectional view) and FIG. 16C (a Y2 cross-sectional view), an etch is used to remove the substrate 202a, stopping on the etch stop layer 202b. As provided above, etch stop layer 202b can be formed from SiGe or an oxide material, and the substrate 202a can be formed from Si. In that case, an Si-selective etch can be used to remove the substrate 202a.

Figure 17A:
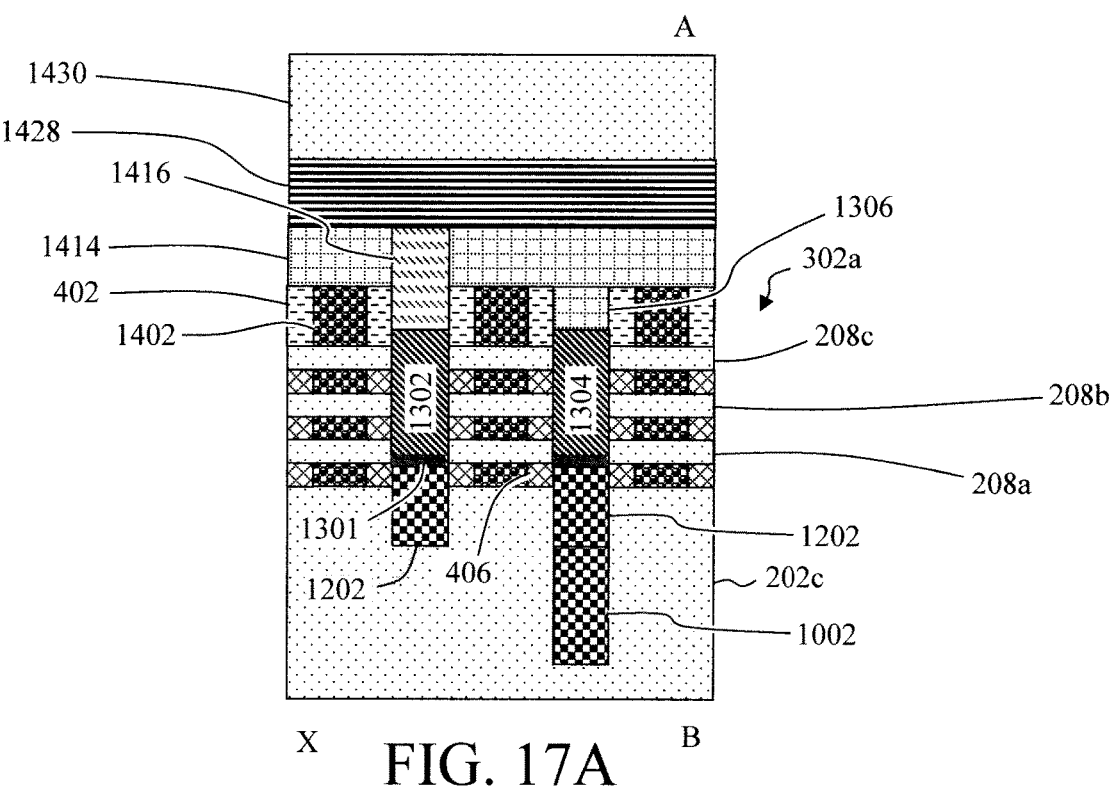
FIG. 17A is an X cross-sectional view.
Figure 17B:
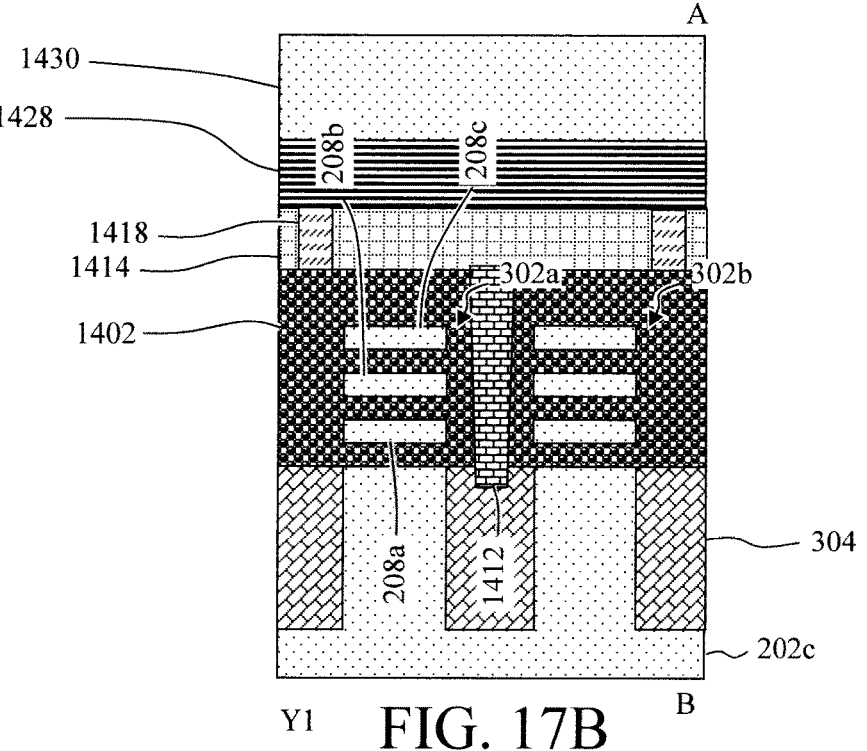
FIG. 17B is a Y1 cross-sectional view.
Figure 17C:
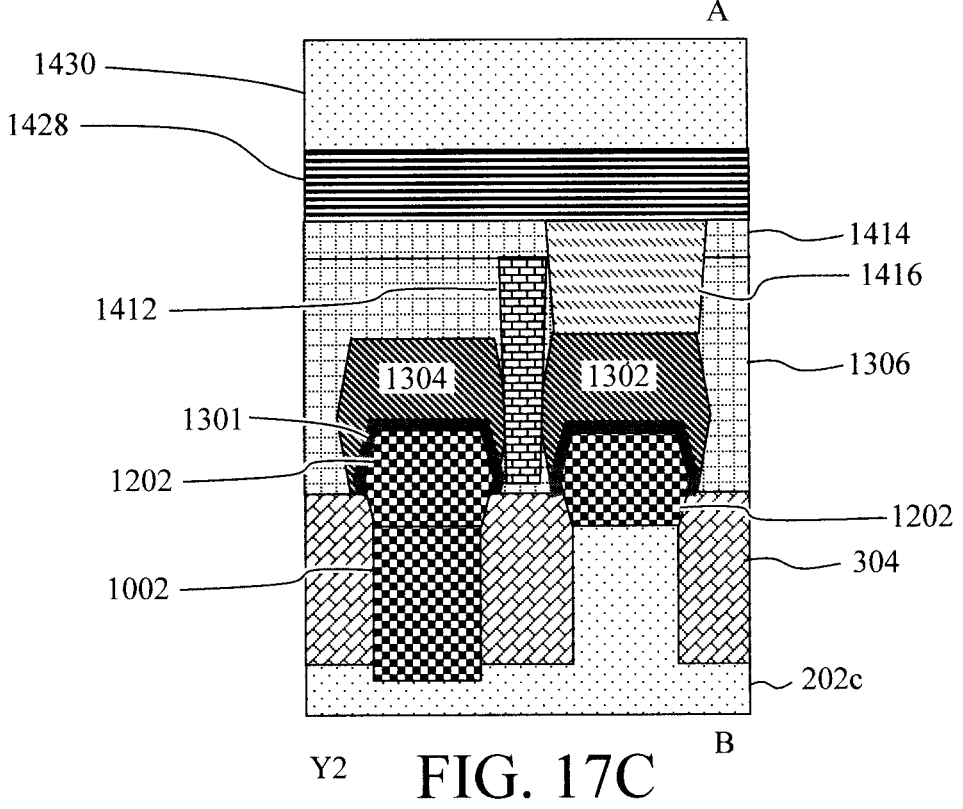
FIG. 17C is a Y2 cross-sectional view illustrating the etch stop layer having been removed according to an embodiment of the present invention.

As shown in FIG. 17A (an X cross-sectional view), FIG. 17B (a Y1 cross-sectional view) and FIG. 17C (a Y2 cross-sectional view), the etch stop layer 202b is removed. As provided above, the etch stop layer 202b can be formed from SiGe or an oxide material. In that case, the etch stop layer 202b can be removed using a SiGe or oxide-selective etch.

Figure 18A:
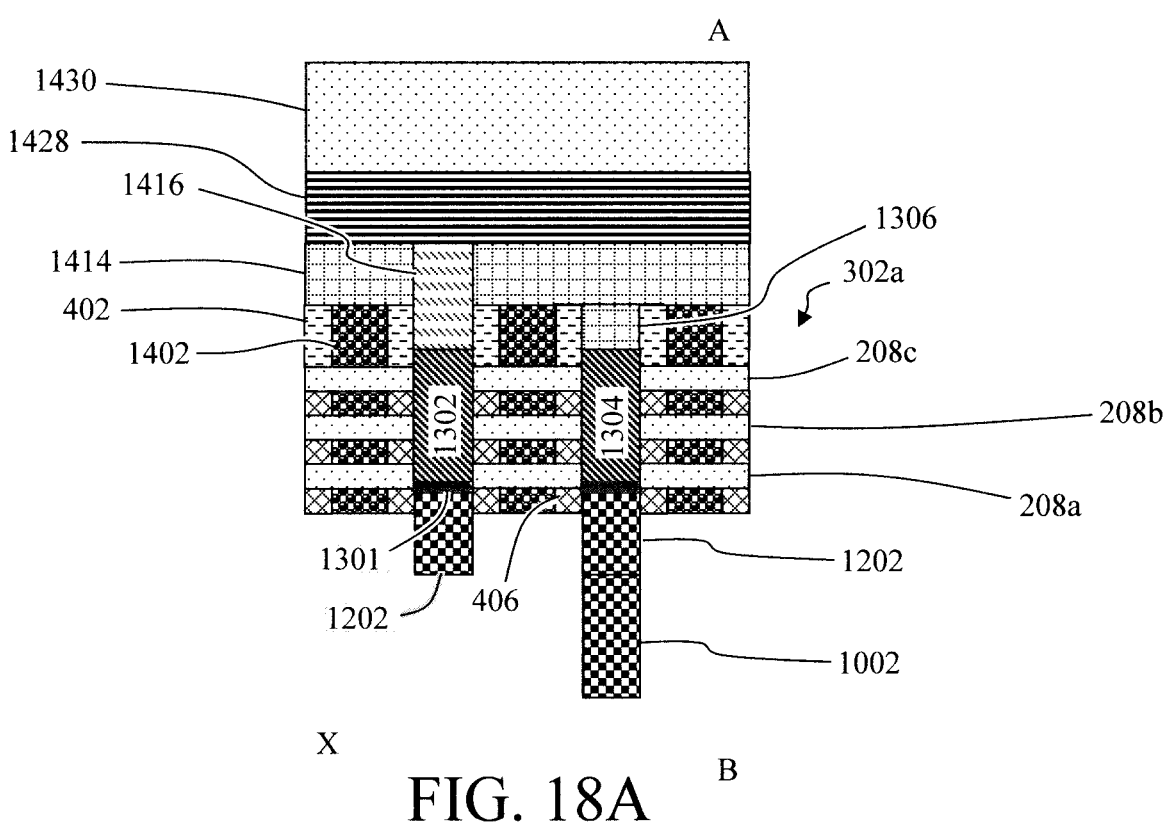
FIG. 18A is an X cross-sectional view.
Figure 18B:
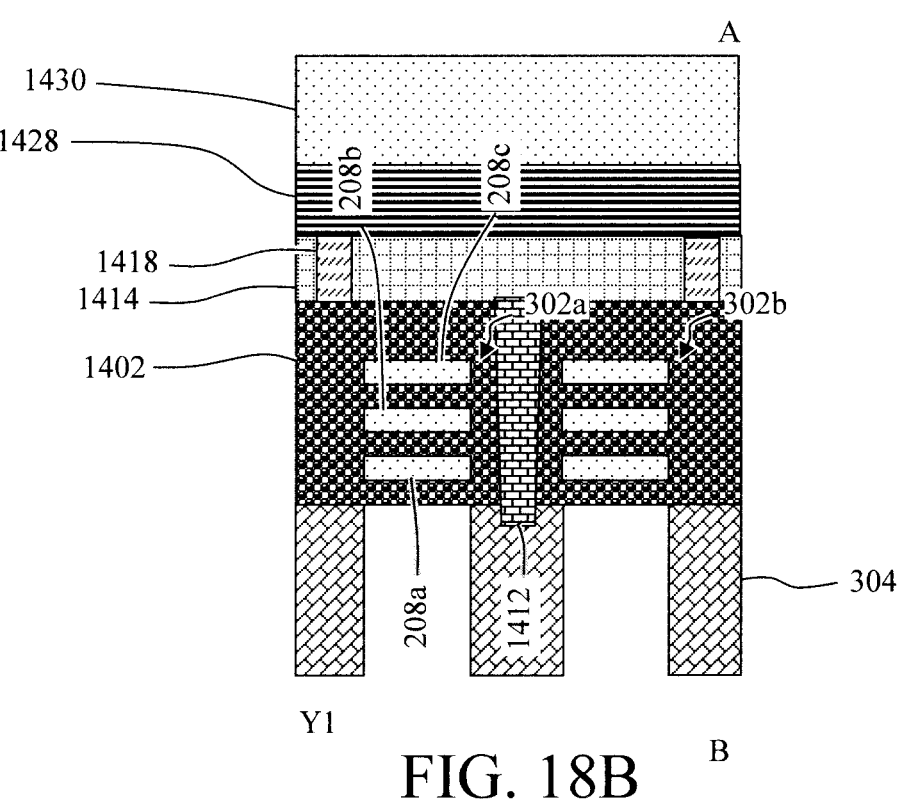
FIG. 18B is a Y1 cross-sectional view.
Figure 18C:
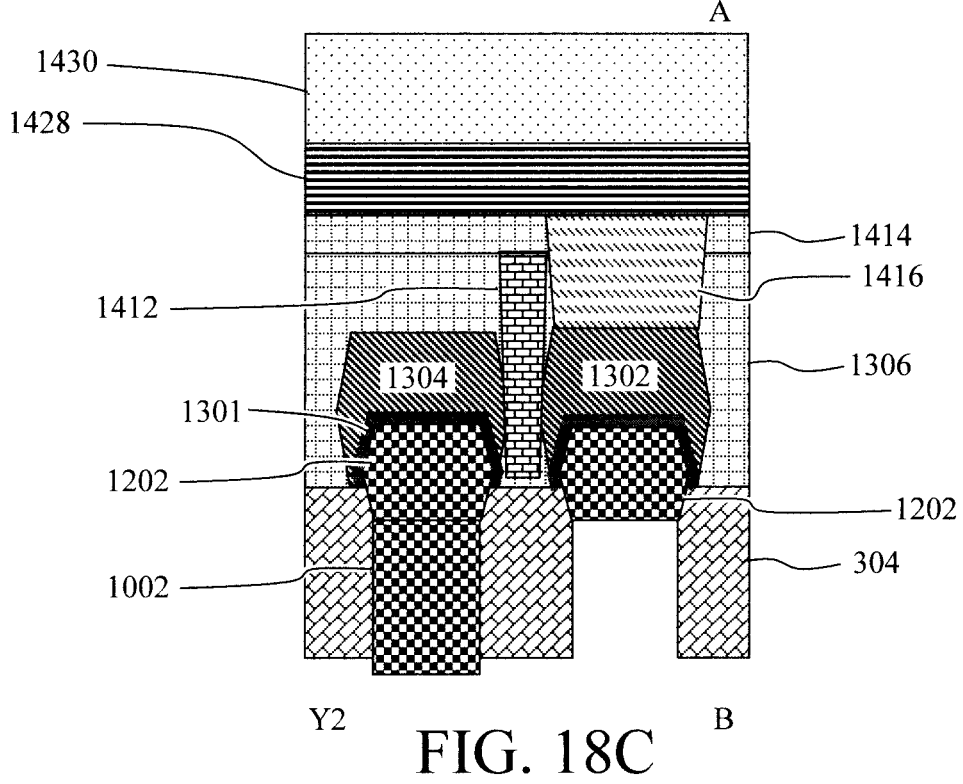
FIG. 18C is a Y2 cross-sectional view illustrating the semiconductor layer having been removed selective to the first and second epitaxial contact placeholders, the replacement gates, and the shallow trench isolation regions according to an embodiment of the present invention.

As shown in FIG. 18A (an X cross-sectional view), FIG. 18B (a Y1 cross-sectional view) and FIG. 18C (a Y2 cross-sectional view), semiconductor layer 202c is removed selective to the first and second epitaxial contact placeholders 1002 and 1202, replacement gates 1402, and shallow trench isolation regions 304. As provided above, the semiconductor layer 202c can be formed from Si. In that case, the semiconductor layer 202c can be removed relative to the first and second epitaxial contact placeholders 1002 and 1202, replacement gates 1402, and shallow trench isolation regions 304 using a Si-selective etch. Notably, the first and second epitaxial contact placeholders 1002 and 1202 are present over, and protecting, the first/second source/drain regions 1302 and 1304 during this (backside) removal of semiconductor layer 202c. Thus, any damage to the first/second source/drain regions 1302 and 1304 is avoided.

Semiconductor layer 202c is the last remaining portion of the original wafer 202. Thus, with removal of the semiconductor layer 202c, the wafer 202 has been completely removed from the semiconductor device structure. However, the same convention will still be used regarding the first side (A) and second side (B) when referring to the frontside and the backside, respectively, just that these terms now pertain to the semiconductor device structure (now that the original wafer 202 has been removed). Thus, for instance, using the active layers 208a,b,c, etc., first/second source/drain regions 1302 and 1304, and replacement gates 1402 of the field-effect transistors as a point of reference, those structures such as the first/second interlayer dielectrics 1306/1414, back end of line interconnect layer 1428, and carrier wafer 1430 are on the first side (A), i.e., frontside of the semiconductor device structure. Conversely, those structures such as the first and second epitaxial contact placeholders 1002 and 1202 are on the second side (B), i.e., backside of the semiconductor device structure.

Figure 19A:
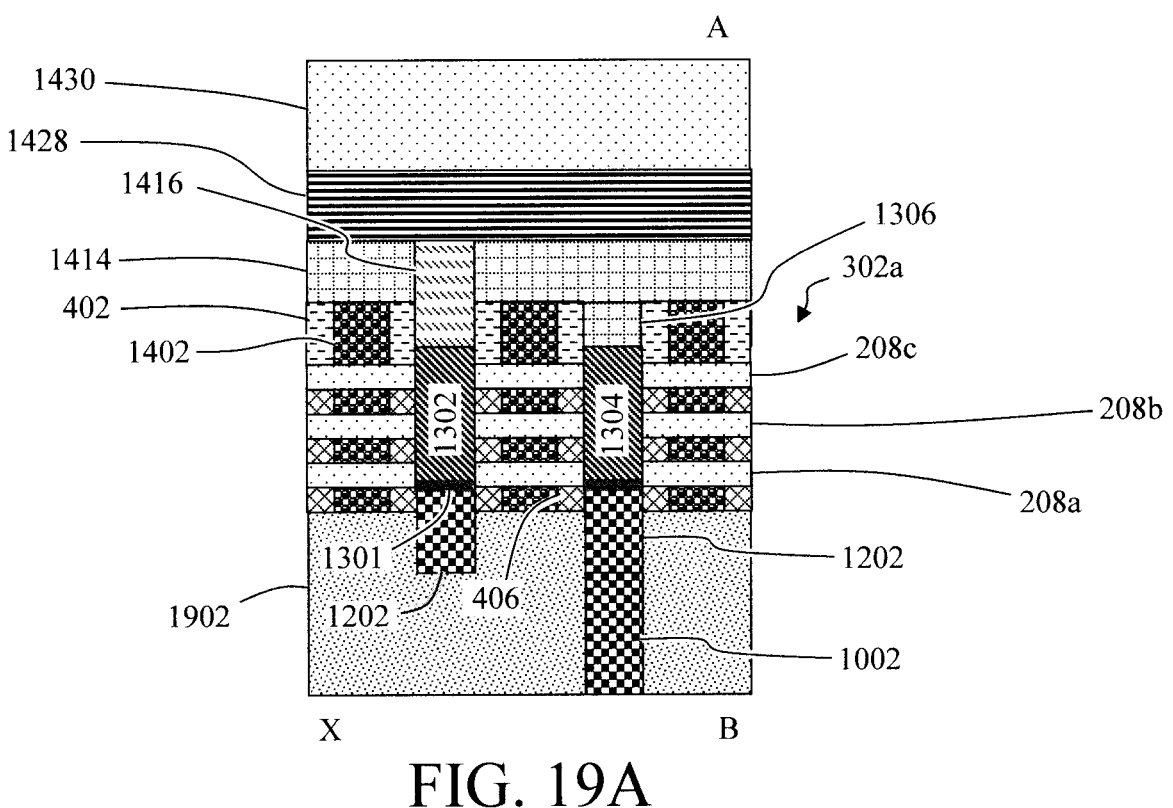
FIG. 19A is an X cross-sectional view.
Figure 19B:
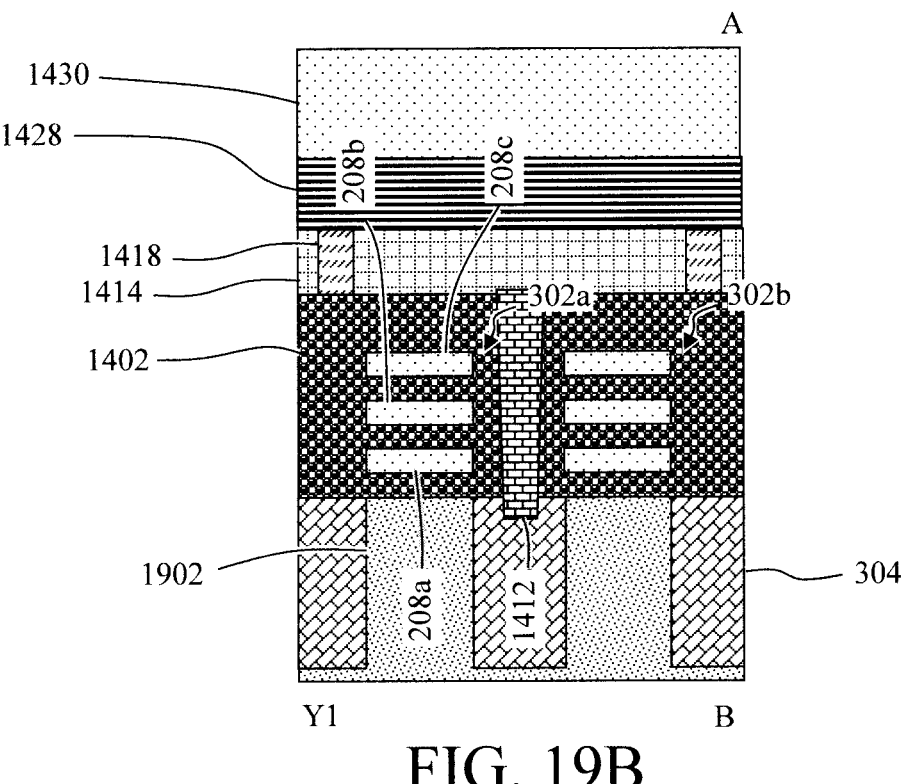
FIG. 19B is a Y1 cross-sectional view.
Figure 19C:
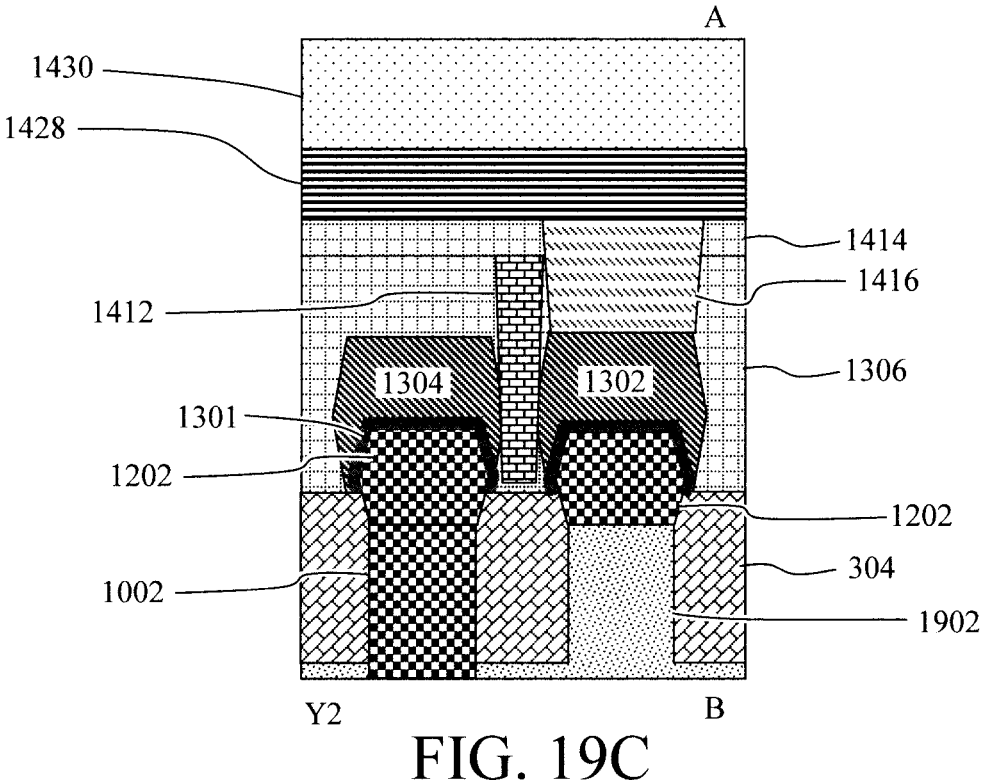
FIG. 19C is a Y2 cross-sectional view illustrating a (backside) interlayer dielectric having been deposited onto the second side (B), i.e., backside, of the semiconductor device structure according to an embodiment of the present invention.

As shown in FIG. 19A (an X cross-sectional view), FIG. 19B (a Y1 cross-sectional view) and FIG. 19C (a Y2 cross-sectional view), another (backside) interlayer dielectric 1902 is next deposited onto the second side (B), i.e., backside, of the semiconductor device structure. For clarity, the term 'third' may also be used herein when referring to interlayer dielectric 1902 so as to distinguish it from the 'first' interlayer dielectric 1306 and the 'second' interlayer dielectric 1414.

Suitable interlayer dielectric 1902 materials include, but are not limited to, SiN, SiOC and/or oxide low-K materials such as SiOx and/or oxide ULK-ILD materials such as pSiCOH, which can be deposited using a process such as CVD, ALD or PVD. Following deposition, the interlayer dielectric 1902 can be planarized using a process such as chemical mechanical polishing, thereby exposing the first epitaxial contact placeholder 1002 beneath the second source/drain region 1304 at the second side (B), i.e., backside, of the semiconductor device structure. Notably, the second epitaxial contact placeholder 1202 beneath the first source/drain region 1302 (originally formed in first/shallow trench 404—see above) does not extend as far into the (backside) interlayer dielectric 1902, and thus is not exposed during this polishing step.

Figure 20A:
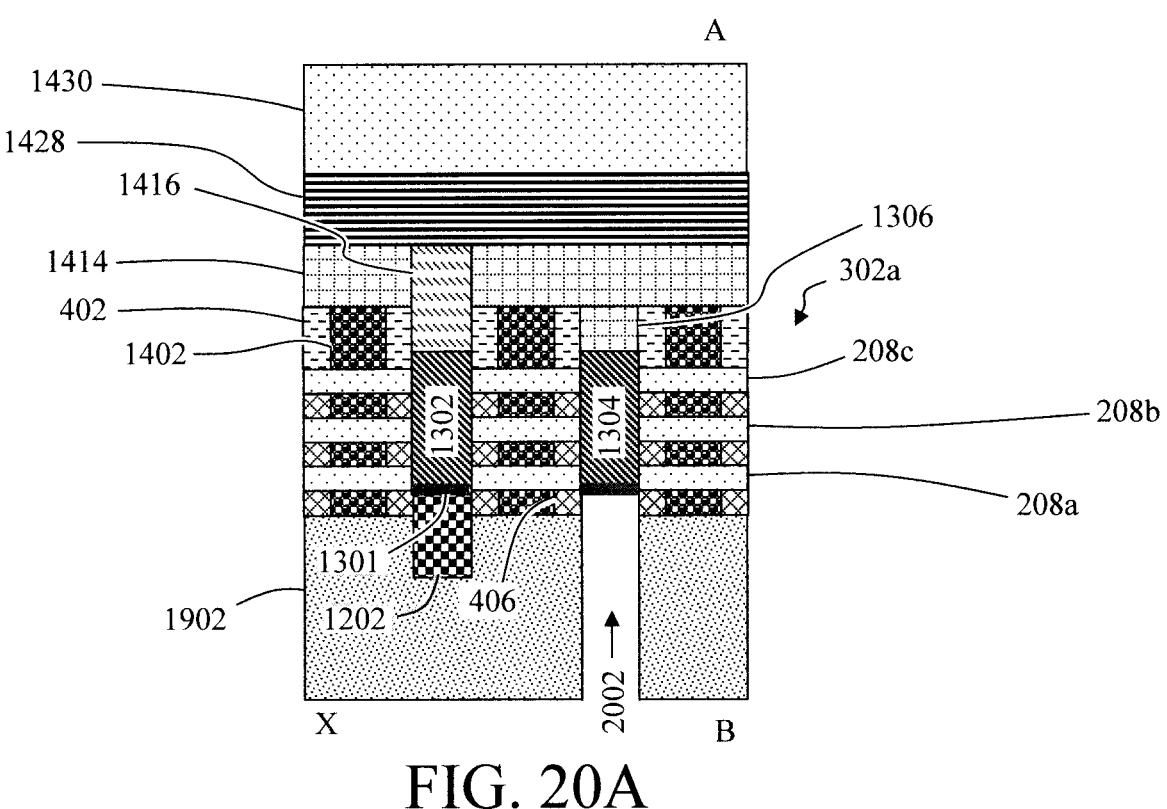
FIG. 20A is an X cross-sectional view.
Figure 20B:
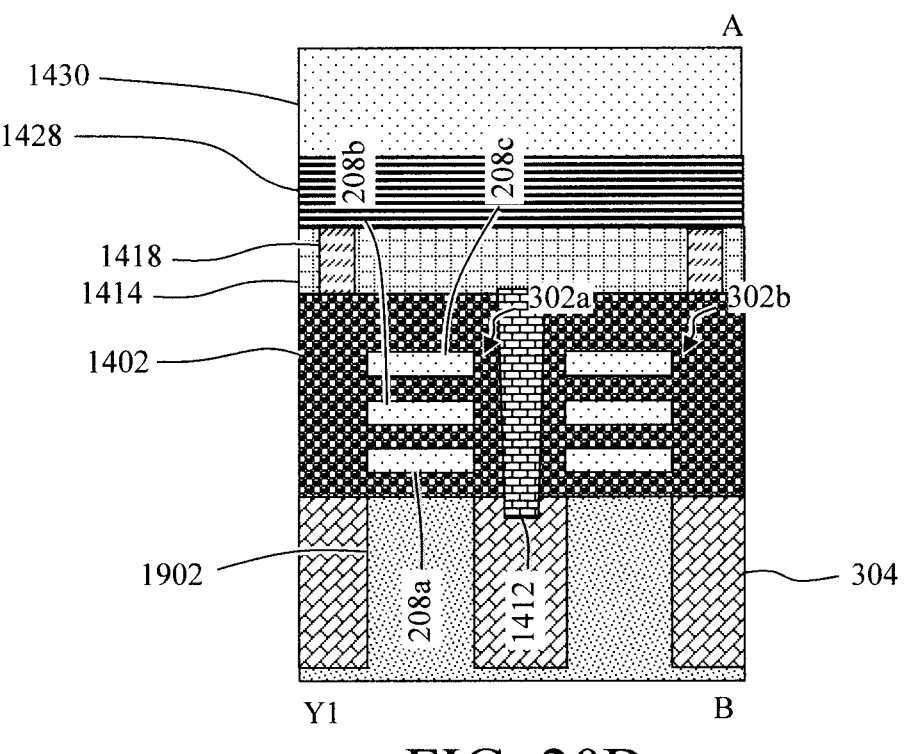
FIG. 20B is a Y1 cross-sectional view.
Figure 20C:
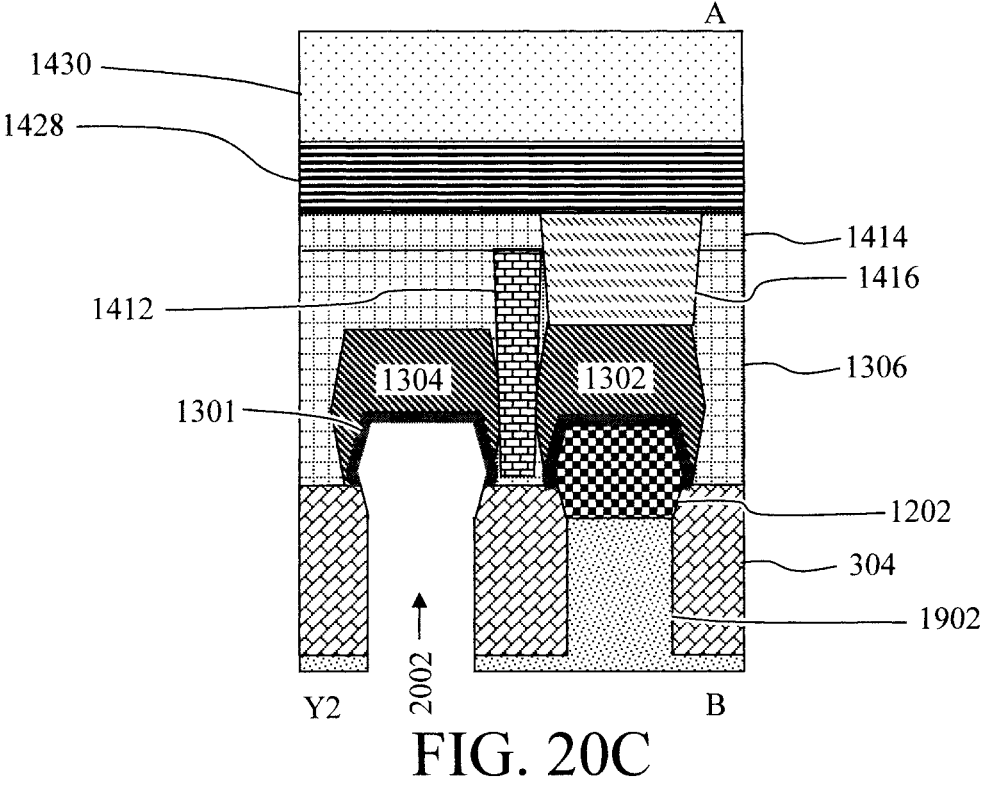
FIG. 20C is a Y2 cross-sectional view illustrating the first and second epitaxial contact placeholders beneath the second source/drain region having been removed to form a cavity beneath the second source/drain region on the second side (B), i.e., backside, of the semiconductor device structure according to an embodiment of the present invention.

As shown in FIG. 20A (an X cross-sectional view), FIG. 20B (a Y1 cross-sectional view) and FIG. 20C (a Y2 cross-sectional view), the first and second epitaxial contact placeholders 1002 and 1202 beneath the second source/drain region 1304 are removed from the second side (B), i.e., backside, of the semiconductor device structure, forming a cavity 2002 beneath the second source/drain region 1304 on the second side (B), i.e., backside, of the semiconductor device structure. As provided above, the first and second epitaxial contact placeholders 1002 and 1202 can be formed from epitaxial SiGe and/or an epitaxial III-V material. In that case, a SiGe- and/or III-V material-selective etch can be employed to remove the first and second epitaxial contact placeholders 1002 and 1202 relative to the, e.g., Si, layer 1301.

Figure 21A:
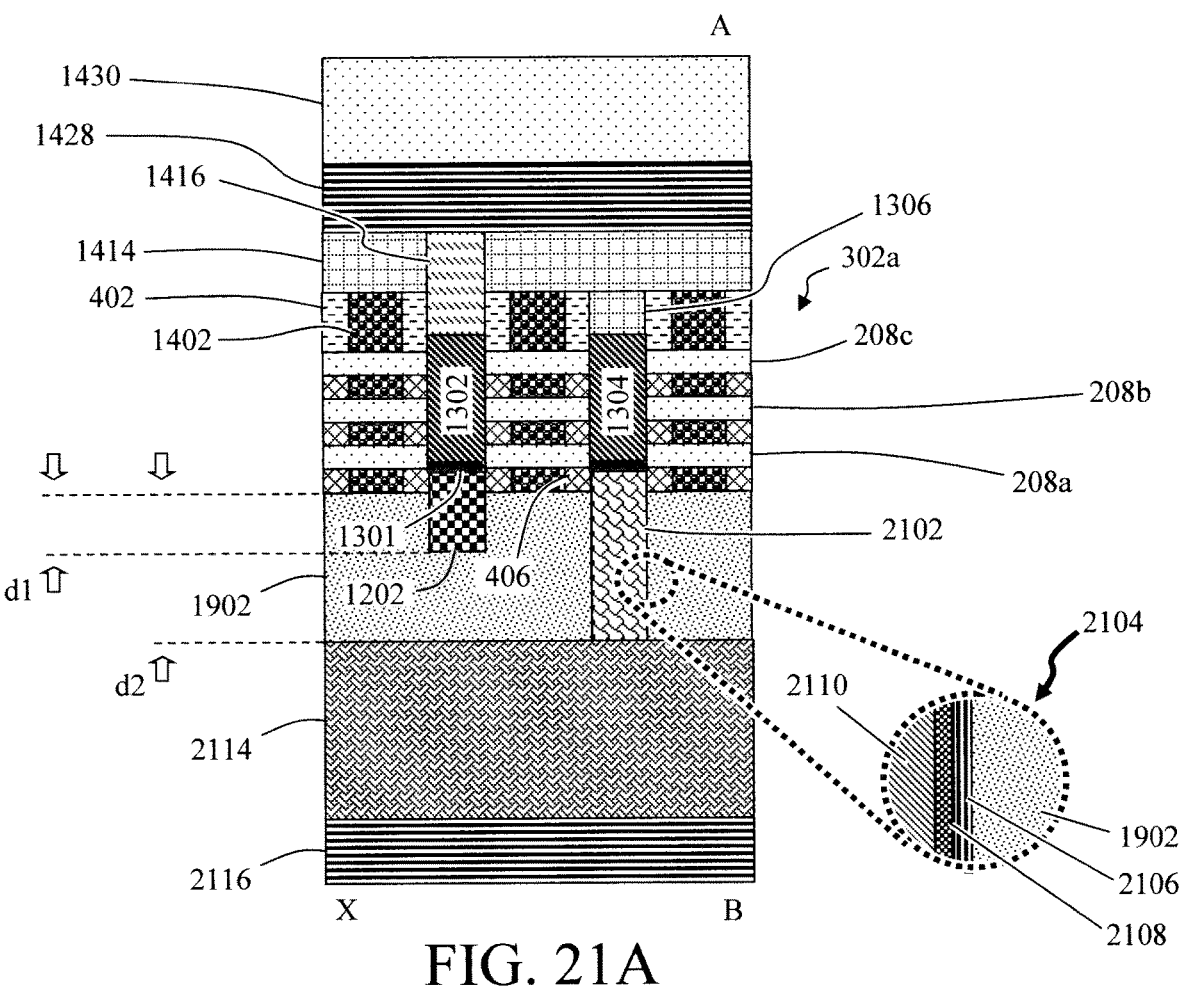
FIG. 21A is an X cross-sectional view.
Figure 21B:
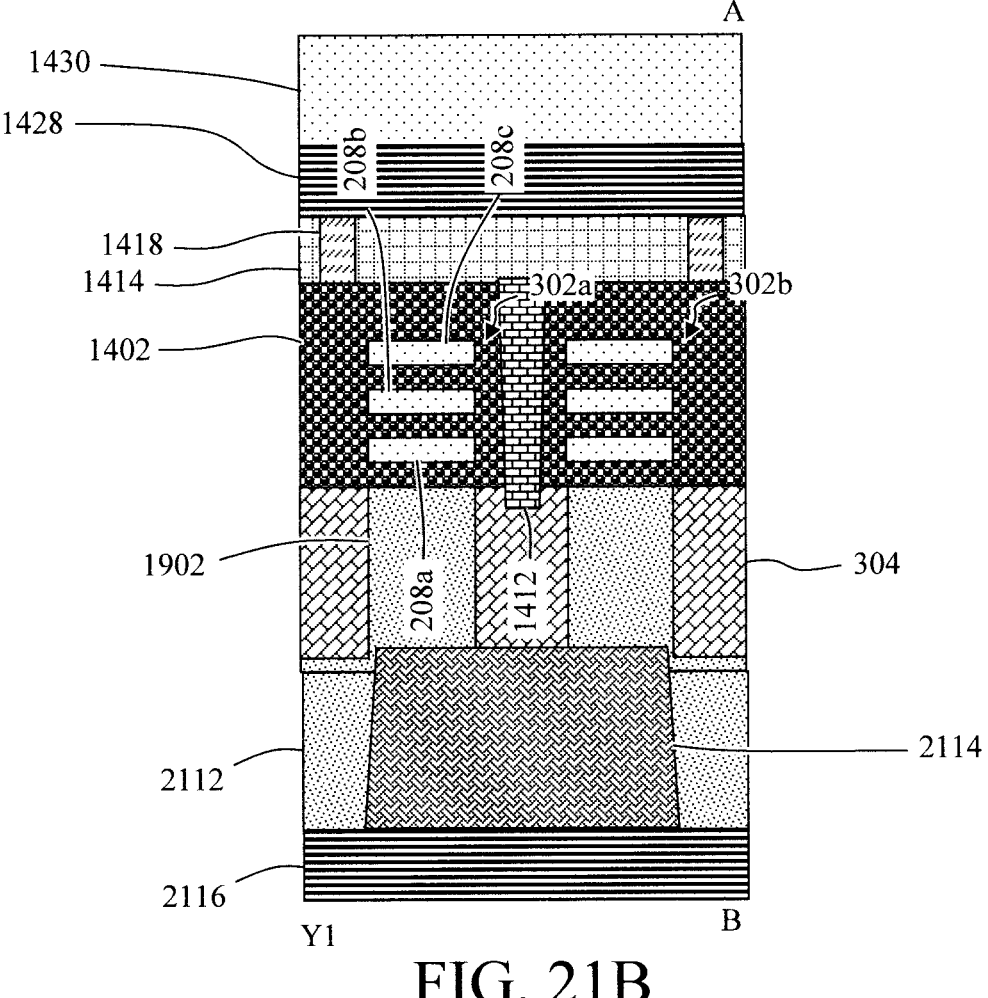
FIG. 21B is a Y1 cross-sectional view.
Figure 21C:
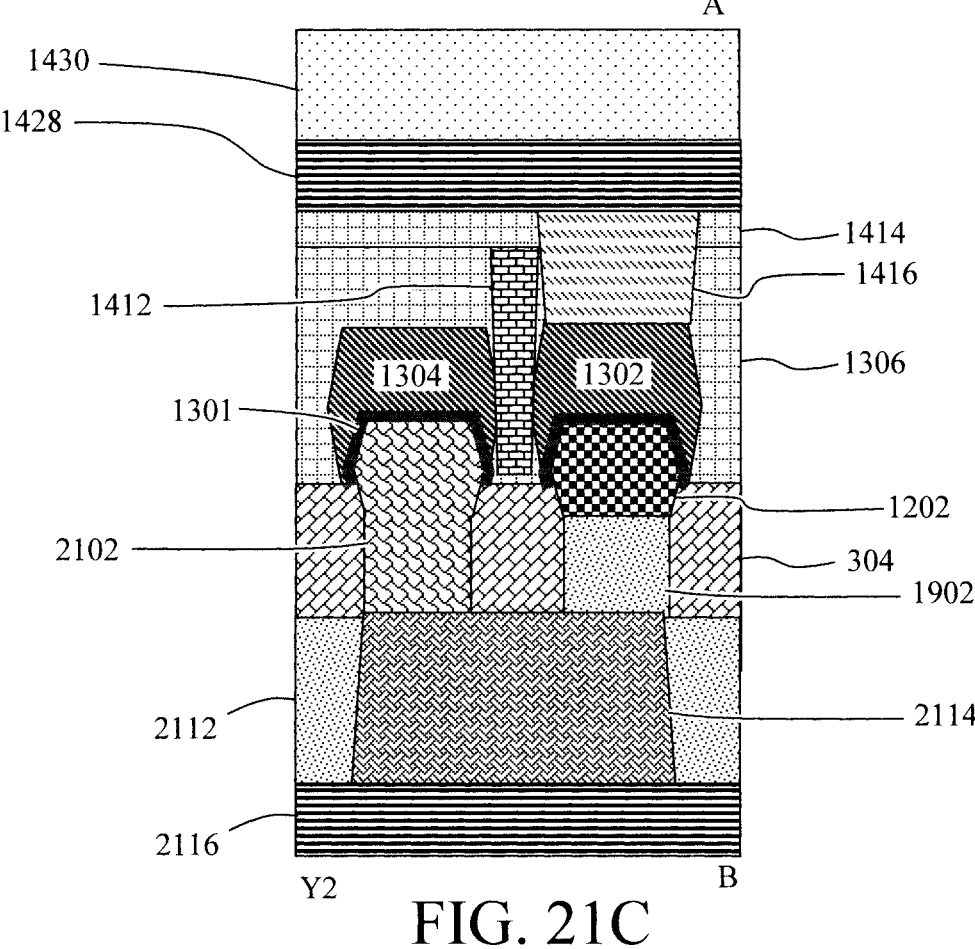
FIG. 21C is a Y2 cross-sectional view illustrating a self-aligned direct backside contact having been formed in the cavity in direct contact with the second source/drain region, a backside power rail having been formed on the (backside) interlayer dielectric in direct contact with the self-aligned direct backside contact, and a backside power delivery network having been formed on the backside power rail according to an embodiment of the present invention.

As shown in FIG. 21A (an X cross-sectional view), FIG. 21B (a Y1 cross-sectional view) and FIG. 21C (a Y2 cross-sectional view), metallization is used to form a self-aligned direct backside contact 2102 in the cavity 2002 that directly contacts the second source/drain region 1304, a backside power rail 2114 is formed on the (backside) interlayer dielectric 1902 in direct contact with the self-aligned direct backside contact 2102, and a backside power delivery network 2116 is formed on the backside power rail 2114. Referring to magnified view 2104 in FIG. 21A, the metallization can include first depositing a silicide liner 2106 into and lining the cavity 2002, depositing a metal adhesion layer 2108 onto the silicide liner 2106, and then depositing a fill metal 2110 onto the metal adhesion layer 2108. Suitable silicide liner 2106 materials include, but are not limited to, Ti, Ni and/or NiPt, which can be deposited using a process such as CVD, ALD or PVD. According to an exemplary embodiment, silicide liner 2106 has a thickness of from about 1 nm to about 5 nm. Suitable metal adhesion layer 2108 materials include, but are not limited to, TiN and/or TaN, which can be deposited onto the silicide liner 2106 using a process such as CVD, ALD or PVD. According to an exemplary embodiment, metal adhesion layer 2108 has a thickness of from about 1 nm to about 5 nm. Suitable fill metals 2110 include, but are not limited to, W, Co, Ru and/or Al, which can be deposited onto the metal adhesion layer 2108 using a process such as CVD, ALD, PVD, sputtering, plating, evaporation, ion beam deposition, electron beam deposition, laser assisted deposition, chemical solution deposition, etc. The overburden is then removed using a process such as chemical mechanical polishing.

The term 'self-aligned' refers to the fact that, by way of the present process, the self-aligned direct backside contact 2102 is automatically positioned directly beneath the second source/drain region 1304. Namely, since the second source/drain region 1304 was grown up from the first/second epitaxial contact placeholders 1002/1202 (see above), then removal and replacement of the first/second epitaxial contact placeholders 1002/1202 places the (replacement) self-aligned direct backside contact 2102 directly in line with the second source/drain region 1304.

Following formation of the self-aligned direct backside contact 2102, it can now be seen that both the epitaxial contact placeholder 1202 (beneath and directly contacting the first source/drain region 1302) and the self-aligned direct backside contact 2102 (beneath and directly contacting the second source/drain region 1304) are embedded in, and surrounded by, the (backside) interlayer dielectric 1902. However, as shown for example in FIG. 21A, based on the present process the epitaxial contact placeholder 1202 extends a (shallow) distance d1 into the (backside) interlayer dielectric 1902 from the first source/drain region 1302, whereas the self-aligned direct backside contact 2102 extends a (deep) distance d2 into the (backside) interlayer dielectric 1902 from the second source/drain region 1304, where d2>d1. Furthermore, it is notable that the middle of line source/drain region contacts 1416 directly contact an end of the first source/drain region 1302 opposite the epitaxial contact placeholder 1202. See, e.g., FIG. 21A. Thus, the first source/drain region 1302 is accessed from the first side (A), i.e., frontside, of the semiconductor device structure (via middle of line source/drain region contacts 1416) and the second source/drain region 1304 is accessed from the second side (B), i.e., backside, of the semiconductor device structure (via self-aligned direct backside contact 2102, which connects the second source/drain region 1304 to the backside power rail 2114).

A (backside) interlayer dielectric 2112 is then deposited onto the interlayer dielectric 1902 over the self-aligned direct backside contact 2102. For clarity, the term 'fourth' may also be used herein when referring to interlayer dielectric 2112 so as to distinguish it from the 'first' interlayer dielectric 1306, the 'second' interlayer dielectric 1414, and the 'third' interlayer dielectric 1902. Suitable interlayer dielectric 2112 materials include, but are not limited to, SiN, SiOC and/or oxide low-K materials such as SiOx and/or oxide ULK-ILD materials such as pSiCOH, which can be deposited using a process such as CVD, ALD or PVD. Following deposition, the interlayer dielectric 2112 can be planarized using a process such as chemical mechanical polishing.

The backside power rail 2114 is then formed in the interlayer dielectric 2112 over, and in direct contact with, the self-aligned direct backside contact 2102. To form backside power rail 2114, a standard lithography and etching process (see above) is employed to pattern trenches in the interlayer dielectric 2112, which are then filled with a metal or combination of metals. Suitable metals for backside power rail 2114 include, but are not limited to, Cu, W, Ru and/or Co, which can be deposited into the trenches using a process such as evaporation, sputtering, ALD, CVD or electrochemical plating. Following deposition, the metal overburden can be removed using a process such as chemical-mechanical polishing. Prior to depositing the metal(s), an adhesion layer (not shown) can be formed lining the trenches. Suitable adhesion layer materials include, but are not limited to, TiN and/or TaN. Additionally, a seed layer (not shown) can also be deposited into and lining the trenches prior to metal deposition, e.g., to facilitate plating of the metal. As shown, for example, in FIG. 21A, the (backside) interlayer dielectric 1902 separates the epitaxial contact placeholder 1202 (and thus the first source/drain region 1302) from the backside power rail 2114.

Backside power delivery network 2116 generally includes backside interconnect structures such as conductive vias and metal lines commonly formed to interconnect the various devices, with the metal lines making lateral connections and the vias making vertical connections amongst different metallization levels. Standard metallization techniques can be employed to form the backside power delivery network 2116. While the individual interconnect structures present in the backside power delivery network 2116 are not specifically shown in the figures, it would be apparent to one skilled in the art how such a backside power delivery network 2116 is implemented for a given semiconductor device application.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor device, comprising:
at least one field-effect transistor on a backside interlayer dielectric;
an epitaxial contact placeholder embedded in, and surrounded by, the backside interlayer dielectric, wherein the epitaxial contact placeholder directly contacts a first source/drain region of the at least one field-effect transistor; and
a self-aligned direct backside contact embedded in, and surrounded by, the backside interlayer dielectric, wherein the self-aligned direct backside contact directly contacts a second source/drain region of the at least one field-effect transistor,
wherein the epitaxial contact placeholder extends a distance d1 into the backside interlayer dielectric from the first source/drain region, wherein the self-aligned direct backside contact extends a distance d2 into the backside interlayer dielectric from the second source/drain region, and wherein d2>d1.

2. The semiconductor device of claim 1, further comprising:
a middle of line source/drain contact in direct contact with an end of the first source/drain region opposite the epitaxial contact placeholder.

3. The semiconductor device of claim 1, wherein the epitaxial contact placeholder comprises a material selected from the group consisting of: epitaxial silicon germanium (SiGe), an epitaxial III-V material, and combinations thereof.

4. The semiconductor device of claim 1, wherein the epitaxial contact placeholder comprises epitaxial SiGe.

5. The semiconductor device of claim 4, wherein the epitaxial SiGe comprises from about 15% germanium (Ge) to about 60% Ge.

6. The semiconductor device of claim 1, further comprising:

a backside power rail disposed on the backside interlayer dielectric, wherein the backside power rail directly contacts the self-aligned direct backside contact.

7. The semiconductor device of claim 6, wherein the backside interlayer dielectric separates the epitaxial contact placeholder from the backside power rail.

8. A semiconductor device, comprising:

at least one field-effect transistor on a backside interlayer dielectric, wherein the at least one field-effect transistor comprises a stack of active layers, a gate surrounding the active layers in a gate-all-around configuration, and source/drain regions on opposite sides of the stack of active layers;

an epitaxial contact placeholder embedded in, and surrounded by, the backside interlayer dielectric, wherein the epitaxial contact placeholder directly contacts a first one of the source/drain regions; and a self-aligned direct backside contact embedded in, and surrounded by, the backside interlayer dielectric, wherein the self-aligned direct backside contact directly contacts a second one of the source/drain regions, wherein the epitaxial contact placeholder extends a distance d1 into the backside interlayer dielectric from the first one of the source/drain regions, wherein the self-aligned direct backside contact extends a distance d2 into the backside interlayer dielectric from the second one of the source/drain regions, and wherein $d2 > d1$.

9. The semiconductor device of claim 8, further comprising:

a middle of line source/drain contact in direct contact with an end of the first one of the source/drain regions opposite the epitaxial contact placeholder.

10. The semiconductor device of claim 8, wherein the epitaxial contact placeholder comprises epitaxial SiGe.

11. The semiconductor device of claim 10, wherein the epitaxial SiGe comprises from about 15% Ge to about 60% Ge.

12. The semiconductor device of claim 8, further comprising:

a backside power rail disposed on the backside interlayer dielectric, wherein the backside power rail directly contacts the self-aligned direct backside contact.

13. The semiconductor device of claim 12, wherein the backside interlayer dielectric separates the epitaxial contact placeholder from the backside power rail.

* * * * *